United States Patent
Kim et al.

(10) Patent No.: US 11,692,136 B2
(45) Date of Patent: Jul. 4, 2023

(54) CORE SHELL QUANTUM DOT, PRODUCTION METHOD THEREOF, AND ELECTRONIC DEVICE INCLUDING THE SAME

(71) Applicant: SAMSUNG ELECTRONICS CO., LTD., Suwon-si (KR)

(72) Inventors: Seon-Yeong Kim, Suwon-si (KR); Soo Kyung Kwon, Suwon-si (KR); Yong Wook Kim, Yongin-si (KR); Ji-Yeong Kim, Suwon-si (KR); Jihyun Min, Seoul (KR); Sungwoo Hwang, Suwon-si (KR); Eun Joo Jang, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 308 days.

(21) Appl. No.: 17/072,335

(22) Filed: Oct. 16, 2020

(65) Prior Publication Data

US 2021/0115332 A1    Apr. 22, 2021

(30) Foreign Application Priority Data

Oct. 17, 2019 (KR) ........................ 10-2019-0129447

(51) Int. Cl.
    *C09K 11/88* (2006.01)
    *C09K 11/54* (2006.01)
    (Continued)

(52) U.S. Cl.
    CPC ............ *C09K 11/883* (2013.01); *C01G 9/006* (2013.01); *C01G 9/08* (2013.01); *C09K 11/06* (2013.01);
    (Continued)

(58) Field of Classification Search
    CPC ....... C09K 11/883; C09K 11/06; C09K 11/54; C09K 11/565; C09K 11/025; C01G 9/006;
    (Continued)

(56) References Cited

U.S. PATENT DOCUMENTS 6,322,901 B1  11/2001  Bawendi et al.
6,861,155 B2   3/2005  Bawendi et al.
(Continued)

FOREIGN PATENT DOCUMENTS

CN    107121454 A    9/2017
CN    107815310 A    3/2018
(Continued)

OTHER PUBLICATIONS

Aqiang Wang et al., "Bright, efficient, and color-stable violet ZnSe-based quantum dot light-emitting diodes," Nanoscale, Jan. 5, 2015, pp. 2951-2959, vol. 7.
(Continued)

*Primary Examiner* — Tracie Y Green
(74) *Attorney, Agent, or Firm* — Cantor Colburn LLP

(57) ABSTRACT

A core-shell quantum dot including a core including a first semiconductor nanocrystal, the first semiconductor nanocrystal including zinc, tellurium, and selenium and a semiconductor nanocrystal shell disposed on the core, the semiconductor nanocrystal shell including zinc and selenium, sulfur, or a combination thereof and a production thereof are disclosed, wherein the core-shell quantum dot does not include cadmium, lead, mercury, or a combination thereof, wherein the core-shell quantum dot(s) includes chlorine, wherein in the core-shell quantum dot, a mole ratio of chlorine with respect to tellurium is greater than or equal to about 0.01:1 and wherein a quantum efficiency of the core-shell quantum dot is greater than or equal to about 10%.

24 Claims, 10 Drawing Sheets

(51) Int. Cl.

| | | |
|---|---|---|
| *C09K 11/56* | (2006.01) | |
| *C09K 11/06* | (2006.01) | |
| *C01G 9/00* | (2006.01) | |
| *C01G 9/08* | (2006.01) | |
| *H01L 27/32* | (2006.01) | |
| *G02F 1/13357* | (2006.01) | |
| *H10K 59/38* | (2023.01) | |
| *F21V 8/00* | (2006.01) | |
| *G02F 1/1335* | (2006.01) | |

(52) U.S. Cl.
CPC ............ *C09K 11/54* (2013.01); *C09K 11/565* (2013.01); *G02F 1/133621* (2013.01); *H10K 59/38* (2023.02); *C01P 2004/64* (2013.01); *C01P 2004/90* (2013.01); *C01P 2006/60* (2013.01); *G02B 6/005* (2013.01); *G02F 1/133614* (2021.01); *G02F 2202/36* (2013.01)

(58) Field of Classification Search
CPC .................. C01G 9/08; G02F 1/133621; G02F 1/133614; G02F 2202/36; G02F 1/133617; G02F 2202/108; H01L 27/322; H01L 27/3211; H01L 51/502; H01L 33/06; C01P 2004/64; C01P 2004/90; C01P 2006/60; G02B 6/005; C01B 19/007

See application file for complete search history.

(56) References Cited

U.S. PATENT DOCUMENTS

| | | |
|---|---|---|
| 7,105,051 B2 | 9/2006 | Peng et al. |
| 7,427,523 B2 | 9/2008 | Boardman et al. |
| 7,981,667 B2 | 7/2011 | Nie |
| 8,035,772 B2 | 10/2011 | Kim et al. |
| 8,252,205 B2 | 8/2012 | Jun et al. |
| 8,420,155 B2 | 4/2013 | Nie et al. |
| 8,436,964 B2 | 5/2013 | Kim et al. |
| 8,545,736 B2 | 10/2013 | Jun et al. |
| 9,082,982 B2 | 7/2015 | Jun et al. |
| 9,517,936 B2 | 12/2016 | Jeong et al. |
| 9,606,281 B2 | 3/2017 | Jang et al. |
| 9,834,724 B2 | 12/2017 | Kim et al. |
| 9,933,658 B2 | 4/2018 | Jang et al. |
| 10,074,770 B2 | 9/2018 | Park et al. |
| 10,160,649 B2 | 12/2018 | Jang et al. |
| 10,446,782 B1 | 10/2019 | Han et al. |
| 10,559,712 B2 | 2/2020 | Park et al. |
| 10,717,649 B2 | 7/2020 | Jang et al. |
| 10,725,340 B2 * | 7/2020 | Park ................. G02F 1/133512 |
| 10,732,458 B2 | 8/2020 | Jang et al. |
| 10,954,440 B2 | 3/2021 | Won et al. |
| 10,988,685 B2 | 4/2021 | Ahn et al. |
| 2005/0102178 A1 | 5/2005 | Phillips et al. |
| 2008/0138514 A1 | 6/2008 | Jang et al. |
| 2010/0110728 A1 | 5/2010 | Dubrow et al. |
| 2010/0283072 A1 | 11/2010 | Kazlas et al. |
| 2011/0175059 A1 | 7/2011 | Kahen et al. |
| 2012/0113671 A1 | 5/2012 | Sadasivan et al. |
| 2012/0113672 A1 | 5/2012 | Dubrow et al. |
| 2016/0167965 A1 | 6/2016 | Jang et al. |
| 2017/0059988 A1 | 3/2017 | Paek et al. |
| 2017/0335187 A1 * | 11/2017 | Guo ..................... C09K 11/70 |
| 2018/0094190 A1 | 4/2018 | Kim et al. |
| 2018/0151817 A1 | 5/2018 | Cho et al. |
| 2019/0086733 A1 | 3/2019 | Min et al. |
| 2019/0097101 A1 | 3/2019 | Dorman |
| 2019/0112527 A1 | 4/2019 | Moriyama et al. |
| 2019/0115492 A1 | 4/2019 | Tamma et al. |
| 2019/0198728 A1 | 6/2019 | Tamma et al. |
| 2019/0211265 A1 * | 7/2019 | Park ........................ A61B 6/584 |
| 2019/0257003 A1 | 8/2019 | Kim et al. |
| 2019/0276734 A1 | 9/2019 | Kim et al. |
| 2019/0276737 A1 | 9/2019 | Won et al. |
| 2019/0348577 A1 | 11/2019 | Pathak et al. |
| 2020/0172802 A1 | 6/2020 | Ahn et al. |
| 2020/0220043 A1 | 7/2020 | Park et al. |
| 2020/0263083 A1 * | 8/2020 | Kim .................... C09K 11/025 |
| 2021/0066634 A1 * | 3/2021 | Park .................... H01L 51/5092 |

FOREIGN PATENT DOCUMENTS

| | | |
|---|---|---|
| CN | 109244201 A | 1/2019 |
| CN | 109280960 A | 1/2019 |
| EP | 3536762 A1 | 9/2019 |
| KR | 100871961 B1 | 12/2008 |
| KR | 101165100 B1 | 7/2012 |
| KR | 1020140032811 A | 3/2014 |
| KR | 101460155 B1 | 11/2014 |
| KR | 1480475 B1 | 1/2015 |
| KR | 20150034621 A | 4/2015 |
| KR | 20180059363 A | 6/2016 |
| KR | 1668480 B1 | 10/2016 |
| KR | 101702000 B1 | 2/2017 |
| KR | 20170074585 A | 6/2017 |
| KR | 20170080795 A | 7/2017 |
| KR | 20180024363 A | 3/2018 |
| KR | 1020180033758 A | 4/2018 |
| KR | 20190003598 A | 1/2019 |
| KR | 20190106823 A | 9/2019 |
| KR | 1020190106819 A | 9/2019 |

OTHER PUBLICATIONS

H Asano et al., "Synthesis of colloidal Zn(Te,Se) alloy quantum dots," Mater. Res. Express, Oct. 3, 2017, pp. 1-10, vol. 106501.

Hiroshi Asano et al., "Colloidal Zn(Te,Se)/ZnS Core/Shell Quantum Dots Exhibiting Narrow-Band and Green Photoluminescence," ACS Omega, Jun. 20, 2018, pp. 6703-6709, vol. 3.

T. Maruyama et al., "Compensation centers in ZnSeTe," Journal of Applied Physics, Aug. 26, 1999, pp. 5993-5999, vol. 86, No. 11.

Vladimir Lesnyak et al., "One-step aqueous synthesis of blue-emitting glutathione-capped ZnSe1," Communication, Dec. 8, 2009, pp. 886-888, vol. 46.

Notice of Allowance dated Oct. 25, 2022 in U.S. Appl. No. 17/072,440.

Extended European Search Report dated Mar. 9, 2021, of the corresponding European Patent Application No. 20202240.6.

Guozhi Jia, et al., Heterostructure Type Transformation of Ternary ZnTexSe1-x/ZnSe Core/Shell Quantum Dots, Digest journal of nanomaterials and biostructures vol. 6, No. 1, 2011, pp. 43-53.

Hiroshi Asano et al., ACS Omega (2018), Colloidal Zn(Te,Se)/ZnS Core/Shell Quantum Dots Exhibiting Narrow-Band and Green Photoluminescence.

Peter M. Ndangili, et al., Gallium-Induced Perturbation of Zinc Selenide Quantum Dots Electronics, Chemistry Select, vol. 2, No. 24, Aug. 22, 2017, pp. 7054-7062.

* cited by examiner

CORE SHELL QUANTUM DOT, PRODUCTION METHOD THEREOF, AND ELECTRONIC DEVICE INCLUDING THE SAME

CROSS-REFERENCE TO RELATED APPLICATION

This application claims priority to and the benefit of Korean Patent Application No. 10-2019-0129447 filed in the Korean Intellectual Property Office on Oct. 17, 2019, and all the benefits accruing therefrom under 35 U.S.C. § 119, the entire content of which is herein incorporated by reference.

BACKGROUND

1. Field

A core-shell quantum dot, a production method thereof, and an electronic device including the same are disclosed.

2. Description of the Related Art

Unlike a bulk material, physical characteristics (e.g., energy bandgaps and melting points) of a nanoparticle may be controlled by changing a size of the nanoparticle. For example, a semiconductor nanocrystal particle (also known as a quantum dot) is a crystalline material having a size of several nanometers. The semiconductor nanocrystal particle has a relatively small size and thereby a large surface area per a unit volume, exhibiting a quantum confinement effect and having different properties than bulk materials having the same composition. A quantum dot may absorb light from an excitation source and become excited, emitting an energy corresponding to a bandgap energy of the quantum dot.

SUMMARY

An embodiment provides a cadmium-free quantum dot capable of realizing enhanced, e.g., improved, optical properties such as a luminous efficiency and stability (e.g., oxidation stability).

An embodiment provides a method of producing the aforementioned cadmium-free quantum dot.

An embodiment provides a quantum dot composite including the aforementioned cadmium-free quantum dot.

An embodiment provides an electronic device (e.g., a display device) including the aforementioned cadmium-free quantum dot.

In an embodiment, a core-shell quantum dot(s) (hereinafter, also referred to as quantum dot(s)) includes a core including a first semiconductor nanocrystal, the first semiconductor nanocrystal including zinc, tellurium, and selenium and a semiconductor nanocrystal shell disposed on the core, the semiconductor nanocrystal shell including zinc; and selenium, sulfur, or a combination thereof, wherein the core-shell quantum dot(s) does not include cadmium, lead, mercury, or a combination thereof, wherein the core-shell quantum dot(s) further includes chlorine, and wherein a quantum efficiency of the core-shell quantum dot(s) is greater than or equal to about 10%.

In the core-shell quantum dot(s), a mole ratio of chlorine with respect to tellurium (Cl:Te) is greater than or equal to about 0.01:1.

The core-shell quantum dot(s) may have a quantum efficiency of greater than or equal to about 15%, greater than or equal to about 20%, greater than or equal to about 25%, greater than or equal to about 30%, greater than or equal to about 35%, greater than or equal to about 40%, greater than or equal to about 45%, or greater than or equal to about 50%

In the core, a mole ratio of tellurium with respect to selenium may be greater than or equal to about 0.2:1 and less than or equal to about 5:1.

The core-shell quantum dot(s) may have a mole ratio of tellurium with respect to selenium (Te:Se) that is greater than or equal to about 0.05:1. The mole ratio of tellurium with respect to selenium (Te:Se) may be greater than or equal to about 0.1:1. The mole ratio of tellurium with respect to selenium (Te:Se) may be greater than or equal to about 0.15:1. The mole ratio of tellurium with respect to selenium (Te:Se) may be greater than or equal to about 0.4:1. The mole ratio of tellurium with respect to selenium (Te:Se) may be greater than or equal to about 0.5:1. The mole ratio of tellurium with respect to selenium (Te:Se) may be greater than or equal to about 1:1, greater than or equal to about 1.1:1, or greater than or equal to about 1.2:1. The mole ratio of tellurium with respect to selenium (Te:Se) may be greater than or equal to about 1.3:1, or greater than or equal to about 1.5:1. The mole ratio of tellurium with respect to selenium (Te:Se) may be greater than or equal to about 1.9:1. The mole ratio of tellurium with respect to selenium (Te:Se) may be greater than or equal to about 2:1.

The core-shell quantum dot(s) may have a mole ratio of tellurium with respect to selenium (Te:Se) that is less than or equal to about 4:1. The mole ratio of tellurium with respect to selenium (Te:Se) may be less than or equal to about 3:1. The mole ratio of tellurium with respect to selenium (Te:Se) may be less than or equal to about 2.5:1, or less than or equal to about 2.2:1. The mole ratio of tellurium with respect to selenium (Te:Se) may be less than or equal to about 2:1, less than or equal to about 1.8:1, less than or equal to about 1.7:1, less than or equal to about 1.6:1, less than or equal to about 1.5:1, or less than or equal to about 1.4:1.

In the core-shell quantum dot(s), a mole ratio of tellurium with respect to zinc (Te:Zn) may be greater than or equal to about 0.05:1. In the core-shell quantum dot(s), a mole ratio of tellurium with respect to zinc (Te:Zn) may be greater than or equal to about 0.1:1, or greater than or equal to about 0.2:1. In the core-shell quantum dot(s), a mole ratio of tellurium with respect to zinc (Te:Zn) may be greater than or equal to about 0.3:1, greater than or equal to about 0.35:1, or greater than or equal to about 0.4:1.

The core-shell quantum dot(s) may have a mole ratio of chlorine with respect to tellurium (Cl:Te) of greater than or equal to about 0.1:1, greater than or equal to about 0.15:1, greater than or equal to about 0.2:1, or greater than or equal to about 0.35:1. In the core-shell quantum dot(s), a mole ratio of chlorine with respect to tellurium may be greater than or equal to about 0.4:1.

The core-shell quantum dot(s) may further include aluminum, lithium, or a combination thereof. In an embodiment, the core-shell quantum dot(s) may not include manganese, copper, or a combination thereof.

In an embodiment, the core-shell quantum dot(s) may not include a Group III-V compound. The Group III-V compound may include indium, gallium, or a combination thereof. In an embodiment, the core-shell quantum dot(s) may not include indium phosphide or an alloy thereof (e.g., InZnP).

In an embodiment, the core-shell quantum dot(s) may not include bromine, iodine, or a combination thereof. The core-shell quantum dot(s) may further include fluorine.

In an X-ray photoelectron spectroscopy (XPS) analysis, the core-shell quantum dot(s) may not exhibit a peak of a tellurium oxide.

In an XPS analysis or a Time-of-Flight Secondary Ion Mass Spectrometry (TOF-SIMS) analysis, the core-shell quantum dot(s) may exhibit or may not exhibit a peak of fluorine.

In an XPS analysis or a Time-of-Flight Secondary Ion Mass Spectrometry (TOF-SIMS) analysis, the core-shell quantum dot(s) may exhibit a peak of chlorine (Cl2P).

A maximum photoluminescent peak of the core-shell quantum dot(s) may be in a wavelength range of greater than or equal to about 470 nanometers (nm). A maximum photoluminescent peak of the core-shell quantum dot(s) may be in a wavelength range of greater than or equal to about 480 nm. A maximum photoluminescent peak of the core-shell quantum dot(s) may be in a wavelength range of greater than or equal to about 500 nm. A maximum photoluminescent peak of the core-shell quantum dot(s) may be in a wavelength range of less than or equal to about 600 nm, for example, less than or equal to about 590 nm, less than or equal to about 580 nm, less than or equal to about 570 nm, or less than or equal to about 560 nm.

An ultraviolet-visible (UV-Vis) absorption spectrum of the core-shell quantum dot(s) may include a first absorption peak and a valley adjacent thereto.

The maximum photoluminescent peak of the core-shell quantum dot(s) may have a full width at half maximum (FWHM) of less than about 50 nm, less than or equal to about 45 nm, less than or equal to about 40 nm, less than or equal to about 35 nm, less than or equal to about 34 nm, less than or equal to about 33 nm, less than or equal to about 32 nm, or less than or equal to about 31 nm.

A maximum photoluminescent peak of the core-shell quantum dot(s) may be in a wavelength range of less than or equal to about 540 nm and greater than or equal to about 500 nm and may have a FWHM of less than or equal to about 33 nm. A maximum photoluminescent peak of the core-shell quantum dot(s) may be in a wavelength range of greater than or equal to about 540 nm and less than or equal to about 580 nm and may have a FWHM of less than or equal to about 35 nm.

The core-shell quantum dot(s) may have a quantum efficiency of greater than or equal to about 12%, greater than or equal to about 20%, greater than or equal to about 30%, or greater than or equal to about 35%.

The first semiconductor nanocrystal or the core-shell quantum dot(s) may include $ZnTe_xSe_{1-x}$, wherein x is greater than or equal to about 0.4, greater than or equal to about 0.45, greater than or equal to about 0.5 and less than or equal to about 0.9, less than or equal to about 0.8, less than or equal to about 0.7.

The semiconductor nanocrystal shell may include selenium and sulfur. The semiconductor nanocrystal shell may include ZnSe, ZnS, ZnSeS, or a combination thereof.

The core-shell quantum dot(s) may have a mole ratio of sulfur with respect to selenium (S:Se) of greater than 0:1, greater than or equal to about 0.1:1, greater than or equal to about 0.15:1, greater than or equal to about 0.2:1, greater than or equal to about 0.3:1, greater than or equal to about 0.4:1, greater than or equal to about 0.5:1, greater than or equal to about 0.8:1, greater than or equal to about 1:1, or greater than or equal to about 1.2:1 and less than or equal to about 8:1, less than or equal to about 7.5:1, less than or equal to about 7:1, less than or equal to about 6.5:1, less than or equal to about 6:1, less than or equal to about 5.5:1, less than or equal to about 5:1, less than or equal to about 4.5:1, less than or equal to about 4:1, less than or equal to about 3.7:1, less than or equal to about 3:1, less than or equal to about 2:1, less than or equal to about 1:1, less than or equal to about 0.8:1, or less than or equal to about 0.5:1. The mole ratio of sulfur with respect to selenium (S:Se) may be 0.1:1-8:1, 0.2:1-7:1, 0.3:1-6:1, 0.4:1-5:1, 0.5:1-4:1, 0.6:1-3:1, 0.7:1-2:1, 0.8:1-1:1, or a combined range thereof.

The core-shell quantum dot(s) may have a Zinc Blende crystalline structure in an X-ray diffraction analysis.

The core-shell quantum dot(s) may include an organic ligand and the organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', RHPO(OH), $RPO(OH)_2$, $R_2POOH$, a polymeric organic ligand, or a combination thereof, wherein R and R' are the same or different and are each independently a substituted or unsubstituted C1 to C40 aliphatic hydrocarbon group, a substituted or unsubstituted C6 to C40 aromatic hydrocarbon group, or a combination thereof.

In an embodiment, the organic ligand may not include a multifunctional organic compound having a thiol moiety; and an amino group, a carboxylic acid group, or a combination thereof. In an embodiment, the organic ligand may not include glutathione compound.

The core-shell quantum dot(s) may be water-insoluble. When dispersed in water, the core-shell quantum dot(s) may show, e.g., exhibit, an average particle size of greater than or equal to about 500 nm as determined by a dynamic light scattering (DLS) analysis.

When dispersed in an organic solvent (such as toluene, octane, or the like), the core-shell quantum dot(s) may be configured to form an organic solution having an average particle size of less than or equal to about 200 nm as determined by a DLS analysis.

In an embodiment, a quantum dot population includes a plurality of the aforementioned quantum dot(s), wherein an average roundness of the plurality of the aforementioned quantum dots may be greater than or equal to about 0.70.

The average roundness of the core-shell quantum dots may be greater than or equal to about 0.75. The average roundness of the core-shell quantum dots may be greater than or equal to about 0.80 or greater than or equal to about 0.82.

An average solidity may be greater than or equal to about 0.8, greater than or equal to about 0.85, or greater than or equal to about 0.9.

An average particle size of the core-shell quantum dots may be greater than or equal to about 3 nm, greater than or equal to about 3.5 nm, greater than or equal to about 4 nm, greater than or equal to about 4.5 nm, greater than or equal to about 5 nm, greater than or equal to about 5.5 nm, greater than or equal to about 6 nm, greater than or equal to about 6.5 nm, greater than or equal to about 7 nm, greater than or equal to about 8 nm, greater than or equal to about 9 nm, or greater than or equal to about 10 nm. n average particle size of the core-shell quantum dots may be less than or equal to about 50 nm, less than or equal to about 40 nm, less than or equal to about 35 nm, less than or equal to about 30 nm, less than or equal to about 25 nm, less than or equal to about 20 nm, less than or equal to about 15 nm, less than or equal to about 10 nm, less than or equal to about 9 nm, less than or equal to about 8 nm, less than or equal to about 7 nm, less than or equal to about 6 nm, less than or equal to about 5 nm, or less than or equal to about 4 nm.

In an embodiment, a method of manufacturing the core-shell quantum dot(s) includes:

preparing a zinc precursor organic solution including a zinc precursor and a first organic ligand in a first organic solvent; and while heating the zinc precursor organic solution, adding a first selenium precursor, a tellurium precursor, a metal hydride compound, and a second organic ligand to the zinc precursor organic solution to prepare a core particle, and reacting a zinc precursor with a second selenium precursor, a sulfur precursor, or a combination thereof in a third organic solvent in the presence of the core particle and a shell formation organic ligand to form a semiconductor nanocrystal shell on the core particle, and adding a chlorine precursor to a reaction system (e.g., at a first reaction temperature or at a temperature of formation of the shell) during preparation of the core particle, during formation of the semiconductor nanocrystal shell, or during the preparation of the core particle and the formation of the semiconductor nanocrystal shell.

The method may further include adding a fluorine precursor to the reaction system during preparation of the core particle, during formation of the semiconductor nanocrystal shell, or during the preparation of the core particle and the formation of the semiconductor nanocrystal shell.

The method may further include preparing the chlorine precursor by dissolving a chlorine compound in a fourth organic solvent.

In an embodiment, the tellurium precursor may include tellurium dispersed in a second organic solvent and a concentration of the tellurium in the tellurium precursor is greater than about 0.1 moles per liter (M) or greater than about 0.15 M.

In the preparing of the core, a mole ratio of an added tellurium with respect to an added selenium into a reaction system may be greater than about 0.25:1, for example, greater than or equal to about 0.3:1, greater than or equal to about 0.4:1, greater than or equal to about 0.5:1, or greater than or equal to about 0.6:1.

The first reaction temperature may be greater than or equal to about 280° C. The temperature of the formation of the shell may be greater than or equal to about 250° C. The method may further include mixing the tellurium precursor, the metal hydride compound, and the second organic ligand to form a single mixed solution at a temperature of less than about 80° C. prior to adding to the zinc precursor organic solution.

The second organic ligand may include an aliphatic organic amine compound or a combination thereof.

The metal hydride compound may include lithium, aluminum, or a combination thereof. The metal hydride compound may include lithium aluminum hydride.

The chlorine compound may include a chloride of a polyvalent metal (e.g., zinc, gallium, aluminum, or a combination thereof).

The method may further include adding a fluorine compound to the reaction system. An added amount of the chlorine precursor, (if used) an added amount of the fluorine compound, or an added amount of the chlorine precursor and an added amount of the fluorine compound may be greater than or equal to about 0.01 moles, greater than or equal to about 0.05 moles, greater than or equal to about 0.1 moles, greater than or equal to about 0.2 moles, or greater than or equal to about 0.3 moles, per one mole of sulfur (or one mole of selenium), and less than or equal to about 10 moles, less than or equal to about 5 moles, less than or equal to about 2 moles, or less than or equal to about 1 mole, per one mole of sulfur (or one mole of selenium).

The fourth organic solvent may include a C1 to C30 alcohol solvent such as ethanol, methanol, or the like, a C2 to C30 ketone solvent, an organic phosphine solvent such as trioctylphosphine, or a combination thereof.

In an embodiment, a quantum dot (e.g., polymer) composite includes a (e.g., polymer) matrix; and a plurality of quantum dots dispersed in the (polymer) matrix, wherein the plurality of quantum dots includes the aforementioned (core-shell) quantum dot(s).

The polymer matrix may include a cross-linked polymer, a binder polymer including a carboxylic acid group, or a combination thereof.

The cross-linked polymer may include a polymerization product of a photopolymerizable monomer including a carbon-carbon double bond, a polymerization product of the photopolymerizable monomer and a multiple thiol compound having at least two thiol groups (e.g., at a terminal end of the multiple thiol compound), or a combination thereof.

The core-shell quantum dot (e.g., polymer) composite may further include a metal oxide fine particle (e.g., dispersed in the polymer matrix).

In an embodiment, a display device includes a light emitting element, and the light emitting element comprises a plurality of the core-shell quantum dot(s).

In an embodiment, a display device includes a light emitting element (e.g., a photoluminescent element) and optionally a light source, wherein the light emitting element includes the core-shell quantum dot(s) or the core-shell quantum dot-polymer composite. If present, the light source may be configured to provide the light emitting element with incident light.

The incident light may have a photoluminescence peak wavelength of about 440 nm to about 560 nm (e.g., about 440 nm to about 460 nm).

The light emitting element may include a sheet of the core-shell quantum dot polymer composite.

The light emitting element may include a stacked structure including a substrate and a light emitting layer (e.g., a photoluminescent layer) disposed on the substrate.

The light emitting layer may include a pattern of the core-shell quantum dot polymer composite.

The pattern may include a, e.g., at least one or two, repeating section configured to emit light at a predetermined wavelength.

The display device may be configured to have color reproducibility of greater than or equal to about 80% under a BT2020 standard.

In an embodiment, quantum dots include a core including a first semiconductor nanocrystal, the first semiconductor nanocrystal including zinc, tellurium, and selenium; and a semiconductor nanocrystal shell disposed on the core, the semiconductor nanocrystal shell including zinc, chlorine, and selenium, sulfur, or a combination thereof, wherein an average roundness of the plurality of the core-shell quantum dots is greater than or equal to about 0.70.

In an embodiment, a cadmium free quantum dot capable of emitting light with an enhanced, e.g., improved, efficiency and a reduced FWHM at a desired wavelength (e.g., greater than about 470 nm) may be provided. The quantum dot of an embodiment may be applied to, e.g., used in, various display devices, biolabeling (biosensor, bioimaging), a photodetector, a solar cell, a hybrid composite, or the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
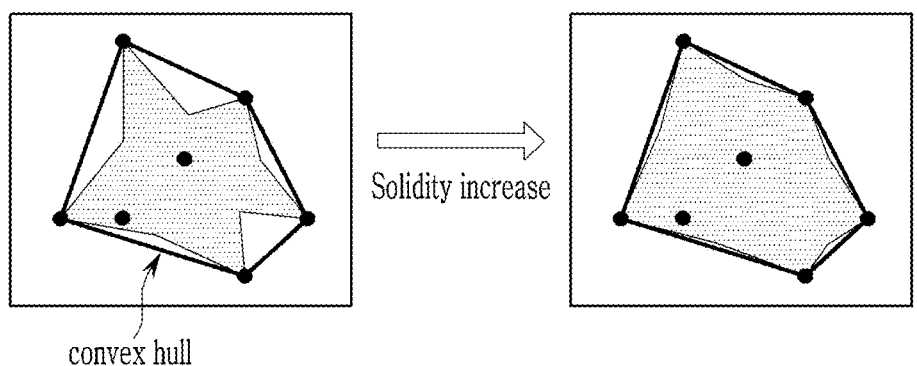
FIG. 1 is a view illustrating the concept of solidity of a particle.

Advantages and characteristics of this disclosure, and a method for achieving the same, will become evident referring to the following example embodiments together with the drawings attached hereto. However, the embodiments should not be construed as being limited to the embodiments set forth herein. Unless otherwise defined, all terms used in the specification (including technical and scientific terms) may be used with meanings commonly understood by a person having ordinary knowledge in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or."

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" may refer to replacement of hydrogen of a compound or a group by a substituent of a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—$NO_2$), a cyano group (—CN), an amino group (—NRR' wherein R and R' are independently hydrogen or a C1 to C6 alkyl group), an azido group (—$N_3$), an amidino group (—C(=NH)$NH_2$), a hydrazino group (—$NHNH_2$), a hydrazono group (=N($NH_2$)), an aldehyde group (—C(=O)H), a carbamoyl group (—C(O)$NH_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—$SO_3$H) or a salt thereof (—$SO_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, a hydrocarbon group refers to a group including (or consisting of) carbon and hydrogen (e.g., an alkyl, alkenyl, alkynyl, or aryl group). The hydrocarbon group may be a group having a valence of one or greater formed by removal of a, e.g., at least one, hydrogen atom from alkane, alkene, alkyne, or arene. In the hydrocarbon group, a, e.g., at least one, methylene may be replaced by an oxide moiety, a carbonyl moiety, an ester moiety, —NH—, or a combination thereof.

As used herein, when a definition is not otherwise provided, "aliphatic" may refers to a saturated or unsaturated linear or branched hydrocarbon group. An aliphatic group may be an alkyl, alkenyl, or alkynyl group, for example.

As used herein, when a definition is not otherwise provided, "alkyl" refers to a linear or branched saturated monovalent hydrocarbon group (methyl, ethyl, hexyl, etc.).

As used herein, when a definition is not otherwise provided, "alkenyl" refers to a linear or branched monovalent hydrocarbon group having one or more carbon-carbon double bond.

As used herein, when a definition is not otherwise provided, "alkynyl" refers to a linear or branched monovalent hydrocarbon group having one or more carbon-carbon triple bond.

As used herein, when a definition is not otherwise provided, "aromatic" refers to an organic compound or group comprising a, e.g., at least one, unsaturated cyclic group having delocalized pi electrons. The term encompasses both hydrocarbon aromatic compounds and heteroaromatic compounds.

As used herein, when a definition is not otherwise provided, "aryl" refers to a group formed by removal of a, e.g., at least one, hydrogen from an aromatic hydrocarbon (e.g., a phenyl or naphthyl group).

As used herein, when a definition is not otherwise provided, "hetero" refers to one including one or more (e.g., 1 to 3) heteroatom of N, O, S, Si, P, or a combination thereof.

As used herein, Group" refers to a group of Periodic Table.

As used herein, "Group III" may refer to Group IIIA and Group IIIB, and examples of Group III metal may be In, Ga, and TI, but are not limited thereto.

As used herein, "Group V" may refer to Group VA, and examples may include nitrogen, phosphorus, arsenic, antimony, and bismuth, but are not limited thereto.

In an embodiment, "roundness" may refer to a definition as provided in The ImageJ User Guide (v 1.46r) and may be defined as follows:

$$4\times((Area)/(\pi\times(major\ axis)^2)).$$

The roundness may correspond to a reciprocal number of an aspect ratio. The aspect ratio may be a ratio of a major axis with respect to a minor axis. The "Area" may be a two-dimensional image area of a given particle and the major axis may refer to a main axis of the best-fitted oval shape of a given image. The roundness may be the one that can reflect a ratio between an inscribed circle and a circumscribed circle for a given object.

As used herein, the term "solidity" refers to a ratio of an area (B) of a two-dimensional area of a quantum dot with respect to an area (A) of a convex hull. The convex hull may be defined as the smallest convex set of points in which a set of all points constituting a two-dimensional image of a given quantum dot obtained by an electron microscopic analysis is contained. Stated otherwise, the convex hull may be defined as a convex polygon of the smallest area in which a set of all points constituting a two-dimensional image of a given quantum dot obtained by an electron microscopic analysis is contained (see FIG. 1). The solidity may be measured by a transmission electron microscopic analysis. For example, a commercially-available computer program (e.g., an image processing program such as "image J") may be used to calculate (an average value of) solidity from a transmission electron microscopy (TEM) image of the quantum dots.

Figure 2:
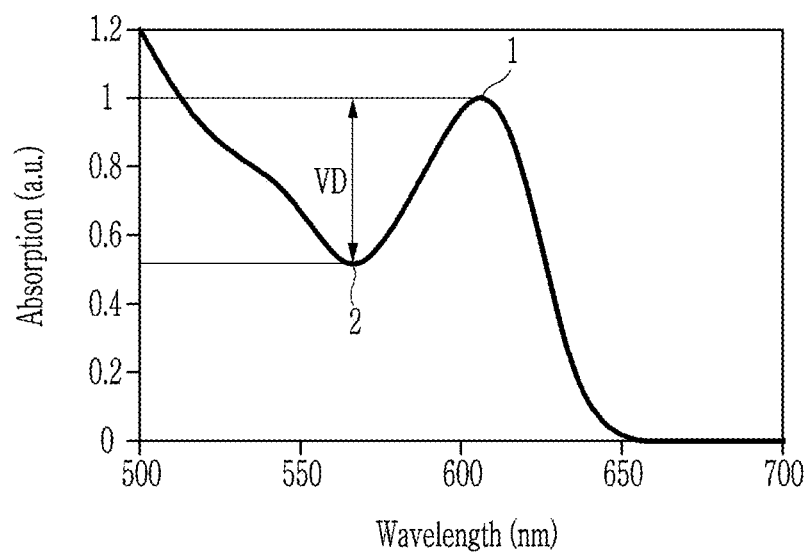
FIG. 2 is a graph of Absorption (arbitrary units (a.u.)) versus Wavelength (nm) illustrating a definition of a valley depth of a UV-Vis absorption spectrum of a quantum dot according to an embodiment.

As used herein, the term "the valley" of the UV-Vis absorption spectrum refers to a portion where a slope of a tangent line of a UV-Vis absorption spectrum curve changes from a negative value to a positive value, as a wavelength increases (see reference numeral 2 in FIG. 2). The valley may exist near the first absorption peak 1 (see FIG. 2).

In a UV-vis absorption spectrum of the (core or core-shell) quantum dot, a depth of the valley adjacent to the first absorption peak (i.e., a valley depth (VD)) may be defined by the following equation:

$$(AbS_{first}-AbS_{valley})/AbS_{first}=VD$$

wherein Abs$_{first}$ is an absorption intensity at a wavelength of the first absorption peak and Abs$_{valley}$ is an absorption intensity at a lowest point of the valley.

As used herein, the term "first absorption peak wavelength" refers to a wavelength of a main excitonic peak appearing first from the longest wavelength region of a UV-vis absorption spectrum of a quantum dot (i.e., appearing in the lowest energy region in the UV-Vis absorption spectrum).

As used herein, "average" (e.g., an average size of the quantum dot) may be mean or median. In an embodiment, the average may be "mean" average.

As used herein, the quantum efficiency may be a relative quantum yield or an absolute quantum yield that can be readily measured by any commercially available equipment. The quantum efficiency (or quantum yield) may be measured in a solution state or a solid state (in a composite). In an embodiment, "quantum yield (or quantum efficiency)" may be a ratio of photons emitted to photons absorbed, e.g., by a nanostructure or population of nanostructures. In an embodiment, the quantum efficiency may be determined by any method. For example, there may be two methods for measuring the fluorescence quantum yield or efficiency: the absolute method and the relative method. The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on their photoluminescent (PL) wavelengths, but are not limited thereto.

The quantum yield (QY) may be readily and reproducibly determined by using commercially available equipment, for example, from Hitachi Co. Ltd or Hamamatsu Co. Ltd and referring to the instruction manuals provided from the manufacturer.

The FWHM and the maximum PL peak wavelength may be determined by a photoluminescent spectrum obtained by a spectrophotometer (or Fluorescence Spectrophotometer).

As used herein, the expression "not including cadmium (or other harmful heavy metal)" may refer to the case in which a concentration of cadmium (or a harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other heavy metal) may be present or, if present, an amount of cadmium (or other heavy metal) may be less than or equal to a detection limit or as an impurity level of a given analysis tool (e.g., an inductively coupled plasma atomic emission spectroscopy).

Semiconductor nanocrystal particles (e.g., a quantum dots) may absorb light from an excitation source and may emit light corresponding to an energy bandgap of the quantum dots. The energy bandgap of the quantum dot may vary with a size and a composition thereof. For example, as the size of the quantum dot increases, the quantum dot may have a narrower energy bandgap and may exhibit an increased light emitting wavelength. Semiconductor nanocrystals may be used as a light emitting material in various fields such as a display device, an energy device, or a bio light emitting device.

Quantum dots having relatively increased photoluminescence properties may include a toxic heavy metal such as cadmium (Cd), lead (Pb), mercury (Hg), or a combination thereof. The toxic heavy metal such as cadmium may cause environmental issues, health issues, or a combination thereof and is one of the restricted elements under Restriction of Hazardous Substances Directive (RoHS) in many countries. Accordingly, development of a cadmium-free quantum dot having improved photoluminescence characteristics is desired. A cadmium free indium phosphide quantum dot (QD) may be applied, e.g., used, in an actual device.

In order to be applied to, e.g., used in, a quantum dot display device (e.g., including a color conversion layer including the quantum dot) and to realize a display device having a relatively high color reproducibility under a next generation color standard such as BT2020, a quantum dot having a relatively narrow full width at half maximum (FWHM) is desired. For example, in order for a device to achieve an enhanced, e.g., improved, color reproducibility under the BT2020 standard, a luminous material used therein may be desired to have a reduced level of a FWHM, e.g., a narrower FWHM. However, in comparison with a Cd based core (e.g., a CdSe core), a Group III-V compound based quantum dot including indium and phosphorus has a smaller bandgap and a larger Bohr radius and changes in the FWHM depending on a size of the quantum dot may be significant. Accordingly, the InP based quantum dot may not have a reduced level of a FWHM, e.g., a narrower FWHM, while emitting light of a desired wavelength (e.g., greater than about 470 nm, greater than or equal to about 475 nm, greater than or equal to about 480 nm, and less than or equal to about 580 nm). In addition, the core including indium and phosphorus may be susceptible to surface oxidation and a quantum dot including the same may have an increased FWHM when including a shell, e.g., a shell is coated on a core of the quantum dot, and it may be difficult to achieve a quantum efficiency of a desired level together with a desired FWHM. Accordingly, quantum dots including a Group III-V compound (e.g., an InP based core) may not show, e.g., exhibit, a desirable FWHM even if the quantum dots including the Group III-V compound have a desirable particle distribution within one monolayer thereof.

The present inventors have found that in case of a ZnTeSe based nanocrystal particle as a cadmium free quantum dot, a wavelength difference caused by a particle distribution may be maintained at a desired low level, and thus a resulting quantum dot may be show, e.g., exhibit, a reduced level of a FWHM, e.g., a narrower FWHM.

However, it may be difficult for a quantum dot structure including a ZnTeSe based core and an inorganic shell coated thereon to exhibit a desired dispersing property (e.g., an organic solvent dispersity) and to show, e.g., exhibit, a desired luminous property. Without wishing to be bound any theory, according to the research of the present inventors, it is believed that a zinc telluride based core is susceptible to oxidation of tellurium in particular during a shell formation and it may be difficult to increase a reaction temperature. Accordingly, during the shell growth, controlling a shape of the particle may become difficult, and the obtained particles may have an arbitrary shape such as a pod shape.

In an embodiment, a core-shell quantum dot (or hereinafter, quantum dots) includes (or include) a core including a first semiconductor nanocrystal material; and a semiconductor nanocrystal shell disposed on the core (or a surface thereof) and including zinc and selenium, sulfur, or a combination thereof.

The core-shell quantum dot does not include cadmium, lead, mercury, or a combination thereof. The core-shell quantum dot of an embodiment further includes chlorine. In the quantum dot, a mole ratio of chlorine with respect to tellurium is greater than or equal to about 0.01:1. A quantum efficiency of the core-shell quantum dot is greater than about 10%. In an embodiment, "not including the cadmium (or a certain element)" may refer to the case in which a concentration of the cadmium (or the certain element) may be less than or equal to about 50 parts per million (ppm) (e.g., ppmw), less than or equal to about 10 ppm (e.g., ppmw), or almost zero.

The core-shell quantum dot (or the core) may include tellurium in a predetermined amount. An amount of components included in the quantum dot as described herein may be determined through an appropriate analysis tool (e.g., an inductively coupled plasma atomic emission spectroscopy (ICP-AES), an X-ray photoelectron spectroscopy (XPS), an ion chromatography, a Transmission electron microscopy energy-dispersive X-ray spectroscopy (TEM-EDS), or the like).

The core may have a structure wherein selenium is alloyed (doped) in a zinc telluride crystal. In the core or in the quantum dot, an amount of the tellurium may be greater than an amount of the selenium.

In the quantum dot of an embodiment, the core may include a first semiconductor nanocrystal including zinc, tellurium, and selenium. The first semiconductor nanocrystal may include $ZnTe_xSe_{1-x}$ (wherein x is greater than or equal to about 0.2, greater than or equal to about 0.3, greater than or equal to about 0.4, greater than or equal to about 0.5, greater than or equal to about 0.51, greater than or equal to about 0.52, greater than or equal to about 0.53, greater than or equal to about 0.54, greater than or equal to about 0.55, greater than or equal to about 0.56, greater than or equal to about 0.57, greater than or equal to about 0.58, greater than or equal to about 0.59, greater than or equal to about 0.6, greater than or equal to about 0.61, greater than or equal to about 0.62, greater than or equal to about 0.63, greater than or equal to about 0.64, greater than or equal to about 0.65, greater than or equal to about 0.66, greater than or equal to about 0.67, greater than or equal to about 0.68, greater than or equal to about 0.69, greater than or equal to about 0.70, greater than or equal to about 0.71, greater than or equal to about 0.72, greater than or equal to about 0.73, greater than or equal to about 0.74, greater than or equal to about 0.75, or greater than or equal to about 0.8 and less than or equal to about 0.9, less than or equal to about 0.89, less than or equal to about 0.88, less than or equal to about 0.87, less than or equal to about 0.86, less than or equal to about 0.85, less than or equal to about 0.84, less than or equal to about 0.83, less than or equal to about 0.82, less than or equal to about 0.8, less than or equal to about 0.75, less than or equal to about 0.7, less than or equal to about 0.65, or less than or equal to about 0.6).

In the core, a mole ratio of tellurium with respect to selenium (Te:Se) may be greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, greater than or equal to about 0.9:1, greater than or equal to about 0.93:1, greater than or equal to about 0.95:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.4:1, greater than or equal to about 2.5:1, greater than or equal to about 2.6:1, greater than or equal to about 2.7:1, greater than or equal to about 2.8:1, greater than or equal to about 2.9:1, or greater than or equal to about 3:1.

In the core, a mole ratio of tellurium with respect to selenium (Te:Se) may be less than or equal to about 5:1, less than or equal to about 4.5:1, less than or equal to about 4:1, less than or equal to about 3.9:1, less than or equal to about 3.8:1, less than or equal to about 3.7:1, less than or equal to about 3.6:1, less than or equal to about 3.5:1, less than or equal to about 3.4:1, less than or equal to about 3.3:1, less than or equal to about 3.2:1, less than or equal to about 3.1:1, less than or equal to about 3:1, less than or equal to about 2.9:1, less than or equal to about 2.8:1, less than or equal to about 2.7:1, less than or equal to about 2.6:1, less than or equal to about 2.5:1, less than or equal to about 2.4:1, less than or equal to about 2.3:1, less than or equal to about 2.2:1, less than or equal to about 2.1:1, less than or equal to about 2.0:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, less than or equal to about 1:1, less than or equal to about 0.9:1, less than or equal to about 0.8:1, less than or equal to about 0.7:1, less than or equal to about 0.6:1, less than or equal to about 0.5:1, or less than or equal to about 0.4:1.

In a core-shell quantum dot of an embodiment, a mole ratio of tellurium with respect to selenium (Te:Se) may be greater than about 0.05:1, for example, greater than or equal to about 0.055:1, greater than or equal to about 0.06:1, greater than or equal to about 0.065:1, or greater than or equal to about 0.07:1. In the quantum dot of an embodiment, a mole ratio of tellurium with respect to selenium (Te:Se) may be greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, greater than or equal to about 0.9:1, or greater than or equal to about 0.95:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.4:1, greater than or equal to about 2.5:1, greater than or equal to about 2.6:1, greater than or equal to about 2.7:1, greater than or equal to about 2.8:1, greater than or equal to about 2.9:1, or greater than or equal to about 3:1.

In the quantum dot of an embodiment, a mole ratio of tellurium with respect to selenium may be less than or equal to about 4:1, less than or equal to about 3.9:1, less than or equal to about 3.8:1, less than or equal to about 3.7:1, less than or equal to about 3.6:1, less than or equal to about 3.5:1, less than or equal to about 3.4:1, less than or equal to about 3.3:1, less than or equal to about 3.2:1, less than or equal to about 3.1:1, less than or equal to about 3:1, less than or equal to about 2.9:1, less than or equal to about 2.8:1, less than or equal to about 2.7:1, less than or equal to about 2.6:1, less than or equal to about 2.5:1, or less than or equal to about 2.4:1, less than or equal to about 2.3:1, less than or equal to about 2.2:1, less than or equal to about 2.1:1, less than or equal to about 2.0:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, less than or equal to about 1:1, or less than or equal to about 0.9:1.

In a quantum dot of an embodiment, a mole ratio of tellurium with respect to zinc (Te:Zn) may be greater than about 0.03:1. In a quantum dot of an embodiment, a mole ratio of tellurium with respect to zinc (Te:Zn) may be greater than or equal to about 0.05:1, greater than or equal to about 0.07:1, greater than or equal to about 0.09:1, greater than or equal to about 0.1:1, greater than or equal to about 0.13:1, greater than or equal to about 0.15:1, greater than or equal to about 0.17:1, greater than or equal to about 0.19:1, greater than or equal to about 0.2:1, greater than or equal to about 0.21:1, greater than or equal to about 0.23:1, greater than or equal to about 0.25:1, greater than or equal to about 0.3:1, greater than or equal to about 0.35:1, or greater than or equal to about 0.4:1. In a quantum dot of an embodiment, a mole ratio of tellurium with respect to zinc (Te:Zn) may be less than about 1:1, for example, less than or equal to about 0.9:1, less than or equal to about 0.8:1, less than or equal to about 0.7:1, less than or equal to about 0.6:1, less than or equal to about 0.5:1, less than or equal to about 0.4:1, less than or equal to about 0.3:1, less than or equal to about 0.2:1, or less than or equal to about 0.1:1 (for example, when being determined by an inductively coupled plasma atomic emission spectroscopy analysis).

In a quantum dot of an embodiment, a mole ratio of zinc with respect to tellurium (Zn:Te) may be greater than about 0.5:1, greater than or equal to about 1:1, greater than or equal to about 1.1:1, greater than or equal to about 1.5:1, greater than or equal to about 2:1, greater than or equal to about 3:1, greater than or equal to about 4:1, greater than or equal to about 5:1, greater than or equal to about 6:1, greater than or equal to about 7:1, greater than or equal to about 8:1, greater than or equal to about 9:1, greater than or equal to about 10:1, or greater than or equal to about 15:1 and less than or equal to about 40:1, less than or equal to about 35:1, less than or equal to about 30:1, less than or equal to about 25:1, less than or equal to about 20:1, less than or equal to about 15:1, less than or equal to about 10:1, less than or equal to about 6:1, less than or equal to about 4:1, less than or equal to about 3:1, or less than or equal to about 2.5:1.

A quantum dot of an embodiment may further include sulfur. In an embodiment, a mole ratio of sulfur with respect to zinc may be greater than or equal to about 0.05:1, greater than or equal to about 0.1:1, greater than or equal to about 0.15:1, greater than or equal to about 0.2:1, greater than or equal to about 0.25:1, greater than or equal to about 0.3:1, or greater than or equal to about 0.35:1 and less than or equal to about 0.95:1, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, less than or equal to about 0.5:1, less than or equal to about 0.4:1, or less than or equal to about 0.3:1.

In a core-shell quantum dot of an embodiment, a mole ratio of sulfur with respect to tellurium (S:Te) may be greater than 0, greater than or equal to about 0.1:1, greater than or equal to about 0.2:1, greater than or equal to about 0.3:1, greater than or equal to about 0.4:1, or greater than or equal to about 0.5:1 and less than or equal to about 8:1, less than or equal to about 7:1, less than or equal to about 6:1, less than or equal to about 5:1, less than or equal to about 4.5:1, less than or equal to about 4:1, less than or equal to about 3.5:1, less than or equal to about 3:1, less than or equal to about 2.5:1, less than or equal to about 2:1, less than or equal to about 1.5:1, less than or equal to about 1:1, less than or equal to about 0.9:1, less than or equal to about 0.8:1, or less than or equal to about 0.7:1.

In the quantum dot, or the core (or the first semiconductor nanocrystal) an amount of tellurium may be greater than an amount of selenium.

In the quantum dot of an embodiment or in the core (or the first semiconductor nanocrystal) thereof, a mole ratio of selenium with respect to tellurium (Se:Te) may be greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, greater than or equal to about 0.9:1, or greater than or equal to about 0.95:1.

In the quantum dot of an embodiment or in the core (or the first semiconductor nanocrystal) thereof, a mole ratio of selenium with respect to tellurium (Se:Te) may be greater than or equal to about 1:1, greater than or equal to about 1.5:1, greater than or equal to about 2:1, greater than or equal to about 2.5:1, greater than or equal to about 3:1, greater than or equal to about 3.5:1, greater than or equal to about 4:1, greater than or equal to about 4.5:1, greater than or equal to about 5:1, or greater than or equal to about 5.5:1.

In the quantum dot of an embodiment or in the core (or the first semiconductor nanocrystal) thereof, a mole ratio of selenium with respect to tellurium (Se:Te) may be less than or equal to about 7:1, less than or equal to about 6.5:1, less than or equal to about 6:1, less than or equal to about 5.5:1, less than or equal to about 5:1, less than or equal to about 4.5:1, less than or equal to about 4:1, less than or equal to about 3.5:1, less than or equal to about 3:1, less than or equal to about 2.5:1, less than or equal to about 2:1, less than or equal to about 1.5:1, less than or equal to about 1:1, less than or equal to about 0.9:1, less than or equal to about 0.85:1, less than or equal to about 0.8:1, less than or equal to about 0.7:1, less than or equal to about 0.6:1, less than or equal to about 0.5:1, or less than or equal to about 0.45:1.

In the quantum dot of an embodiment, a mole ratio of a sum of sulfur and selenium to tellurium ((Se+S)/Te) may be less than or equal to about 15:1, less than or equal to about 14:1, less than or equal to about 13:1, less than or equal to about 12:1, less than or equal to about 11:1, less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, or less than or equal to about 2:1. In the core shell quantum dot of an embodiment, a mole ratio of a sum of sulfur and selenium to tellurium may be greater than or equal to about 0.1:1, greater than or equal to about 0.5:1, greater than or equal to about 1:1, greater than or equal to about 1.5:1, or greater than or equal to about 2:1.

In an embodiment, the quantum dot may not include manganese, copper, or a combination thereof. In an embodiment, the quantum dot may not include a Group III-V compound. The Group III-V compound may include an indium phosphide, an indium zinc phosphide, a gallium phosphide, or a combination thereof. The core-shell quantum dot may not exhibit a peak assigned to the group III-V compound (e.g., an indium phosphide or a gallium phosphide) in an X-ray diffraction analysis.

The core-shell quantum dot of an embodiment may further include gallium, aluminum, lithium, or a combination thereof for example in the core, the semiconductor nanocrystal shell, or a combination thereof. In a quantum dot of an embodiment, the semiconductor nanocrystal shell may not include gallium, aluminum, lithium, or a combination thereof. In a quantum dot of an embodiment, the semiconductor nanocrystal shell may include gallium, aluminum, lithium, or a combination thereof.

In quantum dot(s) of an embodiment, if present, a mole ratio of gallium, aluminum, lithium, or a combination thereof with respect to tellurium may be greater than or equal to about 0.005:1, greater than or equal to about 0.009:1, greater than or equal to about 0.01:1, greater than or equal to about 0.02:1, greater than or equal to about 0.03:1, greater than or equal to about 0.04:1, greater than or equal to about 0.05:1, greater than or equal to about 0.06:1, greater than or equal to about 0.07:1, greater than or equal to about 0.08:1, greater than or equal to about 0.09:1, greater than or equal to about 0.1:1, greater than or equal to about 0.11:1, greater than or equal to about 0.12:1, greater than or equal to about 0.13:1, greater than or equal to about 0.14:1, greater than or equal to about 0.15:1, greater than or equal to about 0.16:1, greater than or equal to about 0.17:1, greater than or equal to about 0.18:1, greater than or equal to about 0.19:1, greater than or equal to about 0.2:1, greater than or equal to about 0.21:1, greater than or equal to about 0.22:1, greater than or equal to about 0.23:1, greater than or equal to about 0.24:1, greater than or equal to about 0.25:1, greater than or equal to about 0.26:1, greater than or equal to about 0.27:1, greater than or equal to about 0.28:1, greater than or equal to about 0.29:1, greater than or equal to about 0.3:1, greater than or equal to about 0.31:1, greater than or equal to about 0.32:1, greater than or equal to about 0.33:1, greater than or equal to about 0.34:1, greater than or equal to about 0.35:1, greater than or equal to about 0.36:1, greater than or equal to about 0.37:1, greater than or equal to about 0.38:1, greater than or equal to about 0.39:1, greater than or equal to about 0.4:1, greater than or equal to about 0.41:1, greater than or equal to about 0.42:1, greater than or equal to about 0.43:1, greater than or equal to about 0.44:1, greater than or equal to about 0.45:1, greater than or equal to about 0.46:1, greater than or equal to about 0.47:1, greater than or equal to about 0.48:1, greater than or equal to about 0.49:1, or greater than or equal to about 0.50:1.

In quantum dot(s) of an embodiment, if present, a mole ratio of gallium, aluminum, lithium, or a combination thereof with respect to tellurium may be less than or equal to about 1.5:1, less than or equal to about 1:1, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, or less than or equal to about 0.55:1. Without wishing to be bound by any theory, the presence of the gallium, aluminum, lithium, or a combination thereof may contribute to enhanced luminous properties of the core-shell quantum dot.

The semiconductor nanocrystal shell may include zinc; and sulfur, selenium, or a combination thereof. The semiconductor nanocrystal shell may be ZnSe, ZnS, ZnSeS, or a combination thereof.

The semiconductor nanocrystal shell may be a multi-layered shell including a plurality of layers. In the plurality of layers for the shell, adjacent layers may have semiconductor nanocrystal material of different compositions. The multi-layered shell may include a first layer disposed directly on the core and a second layer disposed on or over the first layer. The first layer may include a second semiconductor nanocrystal. The second layer may include a third semiconductor nanocrystal having a composition different from the second semiconductor nanocrystal. The second layer may be the outermost layer of the quantum dot. The second semiconductor nanocrystal may include zinc, selenium, and optionally sulfur. In an embodiment, the second semiconductor nanocrystal may not include sulfur. The third semiconductor nanocrystal may include zinc and sulfur. In an embodiment, the third semiconductor nanocrystal may not include selenium. In an embodiment, the first layer may include ZnSe, ZnSeS, ZnS, or a combination thereof. The second layer may consist of ZnS.

In a multi-layered shell, a thickness of each layer may be selected appropriately. The thickness of the layer may be greater than or equal to about 1 monolayer (ML), for example, greater than or equal to about 2 ML, greater than or equal to about 3 ML, greater than or equal to about 4 ML, greater than or equal to about 5 ML and less than or equal to about 10 ML, for example, less than or equal to about 9 ML, less than or equal to about 8 ML, less than or equal to about 7 ML, less than or equal to about 6 ML, or less than or equal to about 5 ML. The thickness of each layer in the multi-layered shell may be selected taking into consideration a desired composition of a final quantum dot.

In an embodiment, the shell or each of the layers in the multi-layered shell may include a gradient alloy having a composition varying in a direction of a radius, e.g., a radial direction from the core toward an outermost surface of the quantum dot. In an embodiment, an amount of the sulfur in the semiconductor nanocrystal shell may increase toward a surface of the quantum dot. For example, in the shell, the amount of the sulfur may increase in a direction away from the core, e.g., in a radial direction from the core toward an outermost surface of the quantum dot.

The core-shell quantum dot of an embodiment further includes chlorine. In an embodiment, the semiconductor nanocrystal shell may include chlorine. In an embodiment, the core may or may not include chlorine.

In the core-shell quantum dot, the presence of the chlorine may be determined for example by an X-ray photoelectron spectroscopy (e.g., a Cl2P peak). In the core-shell quantum dot, a mole ratio of the chlorine with respect to tellurium (Cl:Te) may be greater than or equal to about 0.001:1, greater than or equal to about 0.005:1, greater than or equal to about 0.01:1, greater than or equal to about 0.05:1, greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, or greater than or equal to about 0.4:1. In the core-shell quantum dot, a mole ratio of the chlorine with respect to tellurium (Cl:Te) may be less than or equal to about 7:1, less than or equal to about 6.5:1, less than or equal to about 6:1, less than or equal to about 5.5:1, less than or equal to about 5:1, less than or equal to about 4.5:1, less than or equal to about 4:1, less than or equal to about 3.5:1, less than or equal to about 3:1, less than or equal to about 2.5:1, less than or equal to about 2:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, less than or equal to about 1:1, less than or equal to about 0.9:1, less than or equal to about 0.8:1, less than or equal to about 0.7:1, less than or equal to about 0.6:1, less than or equal to about 0.5:1, less than or equal to about 0.4:1, less than or equal to about 0.3:1, less than or equal to about 0.2:1, or less than or equal to about 0.1:1.

The core-shell quantum dot of an embodiment may further include fluorine. In the quantum dot(s), an amount of the fluorine may be, based on an amount (moles) of zinc, greater than or equal to about 0.01%, greater than or equal to about 0.02%, greater than or equal to about 0.03%, greater than or equal to about 0.04%, greater than or equal to about 0.05%, greater than or equal to about 0.1% and less than or equal to about 1%, less than or equal to about 0.9%, less than or equal to about 0.8%, less than or equal to about 0.7%, less than or equal to about 0.6%, less than or equal to about 0.5%, less than or equal to about 0.4%, less than or equal to about 0.3%, less than or equal to about 0.2%, less than or equal to about 0.1%, less than or equal to about 0.05%, or less than or equal to about 0.04%.

A ZnTe based core (or a $ZnTe_xSe_{(1-x)}$ based alloy core) may provide a quantum dot that can emit light of a desired wavelength of for example less than or equal to about 600 nm, or less than or equal to about 580 nm and greater than or equal to about 490 nm, or greater than or equal to about 500 nm, even without inclusion of a toxic heavy metal.

However, according to the research of the present inventors, a shell formation on such a core may not provide a final core-shell quantum dot of desired luminous properties such as a luminescent wavelength and a luminous efficiency (in particular, as the core has a greater amount of tellurium). Without wishing to be bound by any theory, a Group II-VI compound based core including the tellurium may have poor oxidation stability and oxidation of the tellurium may occur during shell formation, and a full width at half maximum may be increased and luminous efficiency may be decreased. Moreover, the present inventors have also found that when a shell is to be formed on a core including a predetermined amount of tellurium (e.g., wherein x in $ZnTe_xSe_{1-x}$ is greater than or equal to about 0.4), a uniform shell coating may be difficult to achieve, and for example as the growth toward a polar facet (111) becomes predominant, the resulting shell may have a multi-pod shape. Quantum dot having a non-uniform shell coating may have an increased number of surface traps and irregular shape.

The present inventors have found that by the addition of chlorine during a quantum dot synthesis (e.g., during the shell formation), a chloride may contribute to a polar facet passivation, decreasing a facet selectivity in a shell growth and facilitating a shell growth of a uniform shape.

The chlorine added during the shell growth may for example effectively suppress the aforementioned oxidation phenomenon caused by the tellurium included in the core. The core-shell quantum dot of an embodiment includes the chlorine and a particle morphology may be well controlled and a resulting quantum dot may maintain a desired polygon shape when the core-shell quantum dot has a desired thickness of a shell as formed. Accordingly, the core-shell quantum dot of an embodiment may have a desired value of solidity and roundness as set forth herein and the controlled shape of the core-shell quantum dot may also contribute to an improvement of the quantum dot properties (for example, a decrease of the FWHM).

In an embodiment, improvement of the luminous properties due to the addition of the chlorine may be more significant as the tellurium included in the core increases. As an amount of tellurium increases, a resulting core-shell quantum dot may suffer deterioration of luminous properties (e.g., quantum efficiency), for example, a decrease of QY of the core-shell quantum dot by about 10%. When a core includes an increased amount of tellurium (e.g., in the $ZnTe_xSe_{1-x}$, x=0.4 or greater or about 0.6 or greater), using the chlorine compound during a formation of a Zn chalcogenide shell may bring provide a significant increase of the luminous properties (e.g., quantum efficiency) of the final core-shell quantum dots (for example by two times or three times). The quantum dot thus prepared may include a greater amount of the tellurium and exhibit a QY of greater than or equal to about 15%, for example greater than or equal to about 20%, greater than or equal to about 25%.

The core-shell quantum dot(s) (or a population thereof) may have a particle (average) size of greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 7.5 nm, greater than or equal to about 8 nm, greater than or equal to about 8.5 nm, greater than or equal to about 9 nm, greater than or equal to about 9.5 nm, or greater than or equal to about 10 nm. A size (or an average size) of the cadmium free quantum dot (or a population thereof) may be less than or equal to about 50 nm, for example, less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm, less than or equal to about 7 nm, less than or equal to about 6 nm, less than or equal to about 5.5 nm, or less than or equal to about 5 nm. As used herein, the size of the quantum dot may refer to a diameter or an equivalent diameter obtained from a two-dimensional image of an electron microscopy analysis (e.g., under an assumption of a circle). As used herein, "a size" may refer to a size of a single quantum dot or a (e.g., mean or median) average of quantum dots or a population of the quantum dots. A size of the quantum dot(s) may be determined by using a result (e.g., an image) of a (transmission) electron microscopy analysis and any commercially available image analysis computer program (e.g., Image J).

In the quantum dot of an embodiment, a size (or an average size) of the core(s) may be greater than or equal to about 1 nm, for example, greater than or equal to about 2 nm, greater than or equal to about 2.5 nm, greater than or equal to about 3 nm, greater than or equal to about 3.5 nm, greater than or equal to about 4 nm, or greater than or equal to about 4.5 nm. A size (or an average size) of the core(s) may be less than or equal to about 7 nm, less than or equal to about 6 nm, less than or equal to about 5 nm, less than or equal to about 4 nm, less than or equal to about 3 nm, or less than or equal to about 2 nm.

The quantum dot(s) may constitute a population of quantum dots. In an embodiment, for example, by the method of an embodiment as described in detail herein, the quantum dots may exhibit a controlled and improved final morphology, and the quantum dot population of an embodiments may exhibit an increased value of an average solidity, an average roundness, or a combination thereof. As used herein, an average may refer to a mean average or a median average. The quantum dot population of an embodiment may have an average roundness of greater than or equal to about 0.70, greater than or equal to about 0.71, greater than or equal to about 0.72, greater than or equal to about 0.73, greater than or equal to about 0.74, greater than or equal to about 0.75, greater than or equal to about 0.76, greater than or equal to about 0.77, greater than or equal to about 0.78, greater than or equal to about 0.79, greater than or equal to about 0.8, or greater than or equal to about 0.81. The quantum dot population of an embodiment may have an average solidity of greater than or equal to about 0.7, greater than or equal to about 0.75, greater than or equal to about 0.8, greater than or equal to about 0.85, or greater than or equal to about 0.9. The quantum dot population may have such controlled shape parameters, which may indicate a uniform shell growth and that the core passivation can be accomplished.

The population of the aforementioned quantum dots may have a standard deviation of sizes that is less than or equal to about 18%, less than or equal to about 17%, less than or equal to about 16%, less than or equal to about 15%, less than or equal to about 14%, less than or equal to about 13%, less than or equal to about 12%, or less than or equal to about 11% of an average size of the quantum dots. The population of the aforementioned quantum dots may have a standard deviation of sizes that is greater than or equal to about 8%, greater than or equal to about 9%, or greater than or equal to about 10%, of an average size of the quantum dots.

A quantum dot of an embodiment is based on a composition of Zn, Te, and Se and has the foregoing features, e.g., having a relatively wide bandgap and a relatively narrow, e.g., small, Bohr radius, e.g., compared to a cadmium based quantum dot or a Group III-V compound (e.g., InP) based quantum dot. Without wishing to be bound by any theory, in the case of the aforementioned quantum dot of an embodiment, it is understood that a variable breadth of a bandgap of a quantum dot of an embodiment versus a change in a size thereof can be relatively smaller than that of a cadmium based quantum dot or a Group III-V compound (e.g., InP) based quantum dot. Thus, it is believed that in the case of the quantum dot of an embodiment, a size range enabling the quantum dot to have a green light emitting bandgap can be wider than size ranges enabling a cadmium based quantum dot and a Group III-V compound (e.g., InP) based quantum dot to have a green light emitting bandgap, and a cadmium free quantum dot of an embodiment may have a narrower FWHM than a cadmium based quantum dot or a Group III-V compound (e.g., InP) based quantum dot. Conventional QDs including ZnTeSe that emit a green light may have a luminous efficiency less than about 1%. In an embodiment, provided is a quantum dot including a ZnTeSe alloy based core and emitting light of a wavelength of greater than about 470 nm and less than or equal to about 560 nm at a predetermined efficiency, for example, a luminous efficiency of greater than or equal to about 10% or greater than or equal to about 15%.

Surprisingly, the present inventors have found that by adopting a method as described in detail herein, uniformity and roundness of the ZnTeSe core (or a population thereof) may be greatly improved and when a shell of ZnSe, ZnSeS, ZnS, or ZnSe/ZnS is coated on the ZnTeSe core having the foregoing features, a resulting quantum dot may exhibit greatly enhanced, e.g., improved, luminous efficiency and a reduced FWHM. The quantum dots of an embodiment may emit light of a desired range of wavelength with an improved quantum efficiency and reduced FWHM.

In an embodiment, an ultraviolet-visible (UV-Vis) absorption spectrum of the (core or core-shell) quantum dot may include a valley that may be relatively clearly noticed. In a UV-vis absorption spectrum, the quantum dot of an embodiment may have a valley that is adjacent to the first absorption peak or in a range of greater than or equal to about 450 nm (or greater than or equal to about 440 nm, greater than or equal to about 430 nm, or greater than or equal to about 420 nm, or greater than or equal to about 410 nm, or greater than or equal to about 400 nm) up to a wavelength of the first absorption peak.

The quantum dot of an embodiment may exhibit a valley depth of at least a predetermined value. In the UV-vis absorption spectrum of the quantum dot of an embodiment, the valley or the lowest point thereof may be appeared at a wavelength lower, e.g., shorter, than the first absorption peak wavelength. In the UV-vis absorption spectrum of the quantum dot, the intensity of the first absorption peak may be greater than the intensity at the lowest point of the valley adjacent thereto.

Without being bound by any theory, it is believed that in ultraviolet-visible (UV-Vis) absorption spectrum, the presence of the valley or the valley depth may represent a size uniformity of a quantum dot (or a core) or shell coating uniformity of the quantum dot. A noticeable valley depth of a core-shell quantum dot or a core quantum dot may indicate that the (core-shell) quantum dot may have an improved size distribution, an improved coating quality, or a combination thereof, and a narrower FWHM and an increased luminous efficiency may be provided.

In the quantum dot of an embodiment, the valley depth defined herein may be greater than or equal to about 0.01, for example, greater than or equal to about 0.02, greater than or equal to about 0.03, greater than or equal to about 0.04, greater than or equal to about 0.05, greater than or equal to about 0.06, greater than or equal to about 0.07, greater than or equal to about 0.08, greater than or equal to about 0.09, or greater than or equal to about 0.1.

The first absorption peak of the quantum dot may be present in a wavelength range of greater than or equal to about 410 nm, for example, greater than or equal to about 420 nm, greater than or equal to about 430 nm, greater than or equal to about 440 nm, greater than or equal to about 450 nm, greater than or equal to about 460 nm, greater than or equal to about 465 nm, greater than or equal to about 470 nm, greater than or equal to about 475 nm, greater than or equal to about 480 nm.

The lowest point of the valley of the quantum dot may be present in a wavelength range of greater than or equal to about 410 nm, for example, greater than or equal to about 420 nm, greater than or equal to about 430 nm, greater than or equal to about 440 nm, greater than or equal to about 450 nm, greater than or equal to about 460 nm, greater than or equal to about 465 nm, greater than or equal to about 470 nm, greater than or equal to about 475 nm, greater than or equal to about 480 nm.

The first absorption peak of the quantum dot may be present in a wavelength range of less than or equal to about 530 nm, less than or equal to about 525 nm, less than or equal to about 520 nm, less than or equal to about 515 nm, less than or equal to about less than or equal to about 510 nm, less than or equal to about 505 nm, less than or equal to about 500 nm, less than or equal to about 495 nm, less than or equal to about 490 nm, less than or equal to about 485 nm, less than or equal to about 480 nm, less than or equal to about 475 nm, less than or equal to about 465 nm, less than or equal to about 460 nm, less than or equal to about 455 nm, less than or equal to about 450 nm, or less than or equal to about 445 nm.

The lowest point of the valley of the quantum dot may be present in a wavelength range of less than or equal to about 530 nm, less than or equal to about 525 nm, less than or equal to about 520 nm, less than or equal to about 515 nm, less than or equal to about less than or equal to about 510 nm, less than or equal to about 505 nm, less than or equal to about 500 nm, less than or equal to about 495 nm, less than or equal to about 490 nm, less than or equal to about 485 nm, less than or equal to about 480 nm, less than or equal to about 475 nm, less than or equal to about 465 nm, less than or equal to about 460 nm, less than or equal to about 455 nm, less than or equal to about 450 nm, less than or equal to about 445 nm.

In comparison with other quantum dots based on Zn, Te, and Se, the quantum dots of an embodiment may exhibit an improved quantum efficiency, for example, that is greater than or equal to about 10%. The quantum dots of an embodiment may emit light at a quantum efficiency of greater than or equal to about 11%, greater than or equal to about 12%, greater than or equal to about 13%, greater than or equal to about 14%, greater than or equal to about 15%, greater than or equal to about 16%, greater than or equal to about 17%, greater than or equal to about 18%, greater than or equal to about 19%, greater than or equal to about 20%, greater than or equal to about 21%, greater than or equal to about 22%, greater than or equal to about 23%, greater than or equal to about 24%, greater than or equal to about 25%, greater than or equal to about 26%, greater than or equal to about 27%, greater than or equal to about 28%, greater than or equal to about 29%, greater than or equal to about 30%, greater than or equal to about 35%, greater than or equal to about 40%, greater than or equal to about 45%, or greater than or equal to about 50%.

A maximum photoluminescent peak wavelength of the quantum dot may be present in a range of greater than about 470 nm, for example, greater than or equal to about 471 nm, greater than or equal to about 472 nm, greater than or equal to about 473 nm, greater than or equal to about 474 nm, greater than or equal to about 475 nm, greater than or equal to about 476 nm, greater than or equal to about 477 nm, greater than or equal to about 478 nm, greater than or equal to about 479 nm, greater than or equal to about 480 nm, greater than or equal to about 485 nm, greater than or equal to about 490 nm, greater than or equal to about 495 nm, greater than or equal to about 500 nm, greater than or equal to about 505 nm, greater than or equal to about 510 nm, greater than or equal to about 515 nm, or greater than or equal to about 520 nm. The quantum dot may have a maximum PL peak wavelength of less than or equal to about 550 nm, for example, less than or equal to about 540 nm, or less than or equal to about 535 nm. The quantum dot of an embodiment may emit green light. The green light may have a maximum luminescent peak wavelength of from about 500 nm to about 560 nm (e.g., greater than or equal to about 515 nm and less than or equal to about 535 nm).

The (cadmium free) quantum dot of an embodiment may have a FWHM of less than about 50 nm, less than or equal to about 45 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, less than or equal to about 26 nm, or less than or equal to about 25 nm.

The quantum dot may include an organic ligand e.g., on a surface thereof. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, $R_2POOH$, a polymeric organic ligand, or a combination thereof wherein R and R' are the same or different, and are independently a C1 to C40 (e.g., a C3 to C30 or a C6 to C24) substituted or unsubstituted aliphatic hydrocarbon (e.g., alkyl, alkenyl, or alkynyl) group or a C6 to C40 substituted or unsubstituted aromatic hydrocarbon group, or a combination thereof. Two or more different organic ligand may be used.

The organic ligand may coordinate to, e.g., be bound to, the surface of the quantum dot, helping the nanocrystal to be well dispersed in the solution. Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methylphosphine (e.g., trimethylphosphine, methyldiphenylphosphine, etc.), a substituted or unsubstituted ethylphosphine (e.g., triethylphosphine, ethyldiphenylphosphine, etc.), a substituted or unsubstituted propylphosphine, a substituted or unsubstituted butylphosphine, a substituted or unsubstituted pentylphosphine, or a substituted or unsubstituted octylphosphine (e.g., trioctylphosphine (TOP)); a phosphine oxide such as a substituted or unsubstituted methylphosphine oxide (e.g., trimethylphosphine oxide, methyldiphenylphosphine oxide, etc.), a substituted or unsubstituted ethylphosphine oxide (e.g., triethylphosphine oxide, ethyldiphenylphosphine oxide, etc.), a substituted or unsubstituted propylphosphine oxide, a substituted or unsubstituted butylphosphine oxide, or a substituted or unsubstituted octylphosphine oxide (e.g., trioctylphosphine oxide (TOPO)); diphenylphosphine, diphenylphosphine oxide, triphenylphosphine, or triphenylphosphine oxide; a mono- or di(C5 to C20 alkyl)phosphinic acid such as a mono- or dihexylphosphinic acid, a mono- or dioctylphosphinic acid, a mono- or di(dodecyl)phosphinic acid, a mono- or di(tetradecyl)phosphinic acid, a mono- or di(hexadecyl) phosphinic acid, a mono- or di(octadecyl)phosphinic acid, or a combination thereof; a C5 to C20 alkylphosphinic acid, a C5 to C20 alkylphosphonic acid such as hexylphosphonic acid, octylphosphonic acid, dodecylphosphonic acid, tetradecylphosphonic acid, hexadecylphosphonic acid, octadecylphosphonic acid, or a combination thereof; or a combination thereof, and the like, but are not limited thereto. Two or more different organic ligand compound may be used.

In an embodiment, the organic ligand compound may be a combination of RCOOH and an amine (e.g., $RNH_2$, $R_2NH$, $R_3N$, or a combination thereof). In an embodiment, the organic ligand may not include an organic compound having a thiol moiety and an amino group, a carboxylic acid group, or a combination thereof.

In an embodiment, the organic ligand may not include a multifunctional organic compound having a thiol moiety and an amino group, a carboxylic acid, or a combination thereof. In an embodiment, the organic ligand may not include glutathione compound. The quantum dot may be water-insoluble.

When dispersed in water, the quantum dot may show, e.g., exhibit, an average particle size of greater than or equal to about 300 nm, greater than or equal to about 400 nm, greater than or equal to about 500 nm, or greater than or equal to about 900 nm as determined by a dynamic light scattering (DLS) analysis. When dispersed in an organic solvent (such as toluene, octane, or the like), the quantum dot may be configured to form an organic solution having an average particle size of less than or equal to about 500 nm, less than or equal to about 400 nm, less than or equal to about 300 nm, less than or equal to about 200 nm, less than or equal to about 100 nm, or less than or equal to about 90 nm as determined by a DLS analysis. Examples of the organic solvent are described herein.

In an embodiment, a method of manufacturing the core-shell quantum dot(s) includes:

preparing a core particle including the core;

in a first organic solvent, in the presence of the core particle and a shell formation organic ligand, reacting a zinc precursor with a non-metal precursor of a selenium precursor, a sulfur precursor, or a combination thereof at a shell formation temperature to form a semiconductor nanocrystal shell including zinc and selenium, sulfur, or a combination thereof on a surface of the core, wherein the preparing of the core includes preparing a zinc precursor organic solution including a zinc precursor and a first organic ligand in a first organic solvent; and while heating the zinc precursor organic solution at a first reaction temperature, adding thereto a selenium precursor, a tellurium precursor, a hydride compound, and a, e.g., at least one, second organic ligand, and wherein the method further includes adding a chlorine precursor to a reaction system during a core preparation, during a shell formation, or during a core preparation and during a shell formation. The chlorine precursor may be prepared by dissolving a chlorine compound in a fourth organic solvent. In the method of an embodiment, the chlorine precursor may be added to the reaction system during the shell formation.

Details of the composition of the core-shell quantum dot(s) and the core and the semiconductor nanocrystal shell are the same as set forth herein. The synthesized core(s) may be separated from the reaction system (e.g., prior to the shell synthesis) (for example by adding a non-solvent). Details of the non-solvent are set forth herein in detail.

As set forth herein, adoption of the method of an embodiment may provide a quantum dot of relatively improved luminous properties when a shell of the quantum dot is formed on a ZnTeSe alloy core for example including an increased amount of the tellurium. It was widely known that a core-shell quantum dot based on a ZnTeSe alloy core may hardly show a desired luminous property. For example, the quantum dot obtained by forming a shell on the ZnTeSe alloy core tends to exhibit a significantly widened FWHM and have a luminous efficiency of as high as about 1%. Without wishing to be bound by any theory, as explained herein, it is believed that deterioration of the luminous efficiency may attribute to significant oxidation susceptibility of the ZnTeSe alloy core.

Without wishing to be bound by any theory, it is believed that in the method of an embodiment, the chlorine precursor is present during the formation of the core-shell quantum dot (for example, during the formation of the shell) to effectively prevent oxidation of the tellurium at a high temperature reaction, and a decrease in the PLQY can be suppressed when a temperature of the shell formation is elevated higher. An increase of the thickness of a shell grown on a ZnTeSe alloy core may result in a significant change in particle morphology and a final quantum dot having a multi-pod shape. In contrast, according to the method of an embodiment, the presence of the chlorine (e.g., at a predetermined amount) may contribute to a production of a core-shell quantum dot having a polygon shape, and the core-shell quantum dot thus prepared may have the aforementioned shape features (e.g., the average solidity, roundness, or a combination thereof as set forth herein).

In an embodiment, the tellurium precursor used during the core synthesis may include tellurium dispersed in a second organic solvent and a concentration of the tellurium in the tellurium precursor may be greater than about 0.1 M, for example, greater than or equal to about 0.5 M, greater than or equal to about 1 M, greater than or equal to about 1.5 M, greater than or equal to about 2 M, or greater than or equal to about 2.5 M. The concentration of the tellurium may be less than or equal to about 10 M, less than or equal to about 5 M, or less than or equal to about 4 M.

The present inventors have also found that using more than a predetermined amount of a Te precursor (e.g., Te/TOP) to synthesize a core may result in a non-uniform particle size distribution of synthesized cores and non-spherical cores. Without wishing to be bound by any theory, a reactivity of the tellurium in a reaction system is related to a quality of the core as prepared. The tellurium precursor may fail to have a sufficiently strong bond between a chalcogen and a solvent (e.g., TOP). For example, at room temperature, a solvent added in a free state (e.g., a free TOP) may form a Te-TOP bond in the precursor, and unlike other chalcogen precursor, the tellurium precursor may have only a weak bond (e.g., a solvation level bond) with a solvent. In a method of an embodiment, lowering, e.g., decreasing, a ratio, e.g., a mole ratio or a weight ratio, of the solvent with respect to the tellurium (i.e., increasing the concentration of the tellurium in the precursor) may increase a reactivity of the tellurium. In combination with using the hydride compound and the second organic ligand, such an increased reactivity of the tellurium may result in an increase of a valley depth of the core. The increased valley depth of the core may indicate that the given cores have improved quality (such as a uniform surface and a uniform size distribution). In addition, increasing a concentration of a metal precursor in a reaction system may cause a surface coverage of the organic ligand, and the resulting quantum dot may show, e.g., exhibit, a further improved valley depth. Therefore, a core prepared in a method of an embodiment may include an increased amount of organic materials for example, as determined by a Thermal Gravimetric Analysis.

Accordingly, a core prepared according to a method of an embodiment may have improved uniformity of a size distribution together with an improved roundness and more even surface coverage. Without wishing to be bound by any theory, when a shell is formed on the foregoing core, a face selectivity for the shell formation may decrease and thereby a coating with an improved quality may be accomplished. Therefore, a resulting quantum dot of a core-shell structure including a ZnTeSe based core may exhibit enhanced, e.g., improved, luminous properties (e.g., improved quantum efficiency and the improved FWHM).

In an embodiment, on the synthesis of the core, prior to being added to the zinc precursor organic solution, the selenium precursor, the tellurium precursor, the metal hydride compound, and the second organic ligand may be mixed together at a temperature of less than about 80° C., for example, less than or equal to about 75° C., less than or equal to about 70° C., less than or equal to about 65° C., less than or equal to about 60° C., less than or equal to about 55° C., less than or equal to about 50° C., or less than or equal to about 45° C. to form a single stock solution. The temperature may be greater than or equal to about 10° C., greater than or equal to about 20° C., or for example about room temperature.

The second organic ligand may be an aliphatic organic amine compound or a combination thereof. The metal hydride compound may include lithium, aluminum, or a combination thereof. The metal hydride compound may include an aluminum hydride compound, a lithium hydride compound, or a combination thereof. The metal hydride compound may include an organic metal hydride compound (for example, having a, e.g., at least one, hydrocarbon group), an inorganic metal hydride compound, or a combination thereof. The metal hydride compound may include an alkyl lithium hydride (e.g., a dialkyl lithium borohydride wherein each alkyl group may have from 1 to 6 carbon atoms), a lithium aluminum hydride compound, or a combination thereof.

An amount of the metal hydride is not particularly limited and may be selected appropriately. An amount of the metal hydride may be, per one mole of tellurium, greater than or equal to about 0.01 moles, greater than or equal to about 0.05 moles, greater than or equal to about 0.1 moles, greater than or equal to about 0.5 moles, or greater than or equal to about 1 mole. An amount of the metal hydride may be, per one mole of tellurium, less than or equal to about 10 moles, less than or equal to about 5 moles, or less than or equal to about 3 moles.

During preparation of the core, a mole ratio of the tellurium with respect to the selenium introduced into the reaction system (Te:Se) may be greater than about 0.25:1, greater than or equal to about 0.3:1, greater than or equal to about 0.4:1, greater than or equal to about 0.5:1, greater than or equal to about 0.7:1, greater than or equal to about 0.9:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, or greater than or equal to about 2.5:1.

During preparation of the core, a mole ratio of the tellurium with respect to the selenium introduced into the reaction system (Te:Se) may be less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, less than or equal to about 2:1, or less than or equal to about 1.5:1.

During preparation of the core, a mole ratio of the zinc with respect to the tellurium may be selected appropriately taking into consideration a desired composition, the precursor(s), or the like. According to an embodiment, during preparation of the core, an amount of the zinc with respect to one mole of the tellurium may be greater than or equal to about 1 mole, greater than or equal to about 2 moles, greater than or equal to about 3 moles, greater than or equal to about 4 moles, or greater than or equal to about 5 moles. According to an embodiment, during preparation of the core, an amount of the zinc with respect to one mole of the tellurium may be, less than or equal to about 20 moles, less than or equal to about 15 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, or less than or equal to about 2 moles.

In an embodiment, formation of the shell may be carried out by heating (or vacuum treating) a shell metal precursor and an organic ligand in an organic solvent at a predetermined temperature (e.g., at a temperature of greater than or equal to about 100° C., for example, greater than or equal to about 120° C.) under vacuum, changing an atmosphere of a reaction system into an inert gas and heating the same at a predetermined reaction temperature.

The core and a non-metal shell precursor (e.g., sulfur and selenium precursors) may be added into the (heated) reaction system to carry out a reaction. The shell precursor(s) may be injected at the same time or sequentially during the reaction taking into consideration a desired shell composition.

The shell having a desired composition (e.g., a gradient composition or a multi-layered composition) may be formed.

In an embodiment, the formation of the semiconductor nanocrystal shell may include reacting the zinc precursor and the selenium precursor, the sulfur precursor, or a combination thereof. In an embodiment, the semiconductor nanocrystal shell formation may include reacting the zinc precursor and the selenium precursor and then reacting the zinc precursor and the sulfur precursor. For example, in an embodiment, a zinc precursor may react with a selenium precursor to form a first layer including zinc and selenium and then reacted with a sulfur precursor to form a second layer including zinc and sulfur. In an embodiment, a zinc precursor may react with the selenium and the sulfur precursors to form a semiconductor nanocrystal shell including zinc, selenium, and sulfur (e.g., ZnSeS).

The chlorine precursor may be prepared by dissolving a chlorine compound in a fourth organic solvent. The fourth organic solvent may be miscible with the first organic solvent, second organic solvent, third organic solvent, or a combination thereof. In an embodiment, the fourth organic solvent may have a boiling point that is less than the temperature of the shell formation by at least 10° C., for example, by at least 50° C., or by at least 100° C. In an embodiment, the fourth organic solvent may include a C2 to C30 ketone solvent (e.g., acetone), a C1 to C30 alcohol solvent such as ethanol, methanol, or the like, a C1 to C40 alkylphosphine solvent such as TOP, or a combination thereof. The fourth organic solvent may be used for a fluorine compound that will be described below.

The chlorine compound may include a chloride of a polyvalent metal (such as zinc, gallium, aluminum, or indium). The chlorine compound may include zinc chloride, gallium chloride, aluminum chloride, indium chloride, or a combination thereof. The polyvalent metal may be the same as the metal included in the semiconductor nanocrystal shell. In the chlorine precursor, a concentration of the chlorine compound may be determined taking into consideration the types of the chlorine compound and the fourth organic solvent and is not particularly limited. In an embodiment, a concentration of the chlorine compound in the chlorine precursor may be greater than or equal to about 0.1 M, greater than or equal to about 0.2 M, greater than or equal to about 0.3 M, greater than or equal to about 0.4 M, or greater than or equal to about 0.5 M and less than or equal to about 10 M, less than or equal to about 9 M, less than or equal to about 8 M, less than or equal to about 7 M, less than or equal to about 6 M, less than or equal to about 5 M, less than or equal to about 4 M, less than or equal to about 3 M, less than or equal to about 2 M, less than or equal to about 1 M.

The method may further include adding a fluorine compound to the reaction system.

The added amount of the chlorine precursor (or the chlorine compound), (if used) the added amount of the fluorine compound, or the added amount of the chlorine precursor (or the chlorine compound) and the added amount of the fluorine compound may be, based on one mole of sulfur (or selenium), greater than or equal to about 0.001 moles, greater than or equal to about 0.005 moles, greater than or equal to about 0.01 moles, greater than or equal to about 0.03 moles, greater than or equal to about 0.05 moles, greater than or equal to about 0.07 moles, greater than or equal to about 0.09 moles, greater than or equal to about 0.1 mole, greater than or equal to about 0.15 moles, greater than or equal to about 0.2 moles, greater than or equal to about 0.25 moles, greater than or equal to about 0.3 moles, or greater than or equal to about 0.35 moles, or greater than or equal to about 0.4 moles.

The added amount of the chlorine precursor (or the chlorine compound), (if used) the added amount of the fluorine compound, or the added amount of the chlorine precursor (or the chlorine compound) and the added amount of the fluorine compound may be, based on one mole of sulfur (or selenium), less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, less than or equal to about 2 moles, less than or equal to about 1 mole, less than or equal to about 0.9 moles, less than or equal to about 0.8 moles, less than or equal to about 0.7 moles, less than or equal to about 0.6 moles, less than or equal to about 0.5 moles, less than or equal to about 0.4 moles, less than or equal to about 0.3 moles, less than or equal to about 0.2 moles, less than or equal to about 0.1 moles, or less than or equal to about 0.05 moles.

In the method, the zinc precursor may include a Zn powder, ZnO, an alkylated Zn compound (e.g., C2 to C30 alkyl (e.g., dialkyl) zinc such as dimethyl zinc, diethyl zinc), a Zn alkoxide (e.g., a zinc ethoxide), a Zn carboxylate (e.g., a zinc acetate or zinc aliphatic carboxylate, for example, zinc long chain aliphatic carboxylate such as zinc oleate), a Zn nitrate, a Zn perchlorate, a Zn sulfate, a Zn acetylacetonate, a Zn halide (e.g., a zinc chloride), a Zn cyanide, a Zn hydroxide, zinc carbonate, zinc peroxide, or a combination thereof. Examples of the zinc precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium precursor may include tellurium-trioctylphosphine (Te-TOP), tellurium-tributylphosphine (Te-TBP), tellurium-triphenylphosphine (Te-TPP), tellurium-diphenylphosphine (Te-DPP), or a combination thereof, but is not limited thereto.

The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), sulfur-octadecene (S-ODE), bistrimethylsilyl sulfide, ammonium sulfide, sodium sulfide, or a combination thereof.

The first organic solvent, second organic solvent, third organic solvent, or a combination thereof may be same as or different from each other. The first organic solvent, second organic solvent, third organic solvent, or a combination thereof (hereinafter, simply referred to as an organic solvent) may be a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctylphosphine) substituted with a, e.g., at least one (e.g., 1, 2, or 3), C6 to C22 alkyl group, a phosphine oxide (e.g., trioctylphosphine oxide) substituted with a, e.g., at least one (e.g., 1, 2, or 3), C6 to C22 alkyl group, a C12 to C22 aromatic ether such as a phenyl ether or a benzyl ether, or a combination thereof.

The first organic ligand and the second organic ligand may be the same. The first organic ligand and the second organic ligand may be different. Details of the first and the second organic ligands and the shell formation organic ligand are the same as set forth herein with regard to the organic ligand.

In an embodiment, the first organic ligand may include a fatty acid (e.g., including a C5 or greater or 010 or greater aliphatic hydrocarbon group) and the second organic ligand may include a fatty organic (e.g., primary) amine (e.g., including one a C5 or greater, 010 or greater, or a C15 or greater aliphatic or aromatic hydrocarbon group), an aromatic phosphine compound, or a combination thereof. The organic amine may include a compound represented by $RNH_2$, wherein R is an aliphatic hydrocarbon (alkyl, alkenyl, or alkynyl) or a C6 to C40 aryl.

The carbon number of the aliphatic hydrocarbon group may be greater than or equal to about 5, greater than or equal to about 10, greater than or equal to about 15, greater than or equal to about 16, greater than or equal to about 17, greater than or equal to about 18, greater than or equal to about 19, or greater than or equal to about 20; less than or equal to about 50, less than or equal to about 40, or less than or equal to about 30; or a combination thereof.

Amounts of the first organic ligand and the second organic ligand may be selected taking into consideration types of the organic ligands and types of the precursors.

An amount of the first organic ligand (or an amount of the second ligand or an amount of the shell formation organic ligand) may be, with respect to 1 mole of the zinc precursor, greater than or equal to about 0.1 moles, greater than or equal to about 0.2 moles, greater than or equal to about 0.3 moles, greater than or equal to about 0.4 moles, greater than or equal to about 0.5 moles, greater than or equal to about 0.6 moles, greater than or equal to about 0.7 moles, greater than or equal to about 0.8 moles, greater than or equal to about 0.9 moles, greater than or equal to about 1 mole, greater than or equal to about 2 moles, greater than or equal to about 3 moles, greater than or equal to about 4 moles, or greater than or equal to about 5 moles. An amount of the first organic ligand (or an amount of the second ligand or an amount of the shell formation organic ligand) may be, with respect to 1 mole of the zinc precursor, less than or equal to about 20 moles, less than or equal to about 19 moles, less than or equal to about 18 moles, less than or equal to about 17 moles, less than or equal to about 16 moles, less than or equal to about 15 moles, less than or equal to about 14 moles, less than or equal to about 13 moles, less than or equal to about 12 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, less than or equal to about 2 moles, or less than or equal to about 1 mole.

A mole ratio between the first organic ligand and the second organic ligand (the first organic ligand:the second organic ligand) may be 1:about 0.1 or greater, 1:about 0.5 or greater, 1:about 0.9 or greater, or 1:about 1 or greater; 1:about 10 or less; 1:about 5 or less, 1:about 2.5 or less, or 1:about 1.5 or less; or a combination thereof.

In an embodiment, the selenium precursor, the tellurium precursor, the metal hydride compound may be injected into the zinc precursor organic solution in a mixed state optionally together with the organic ligand. In an embodiment, the selenium precursor, the tellurium precursor, and the metal hydride compound may be injected into the zinc precursor organic solution sequentially.

The reaction temperature for the core formation may be greater than or equal to about 250° C., greater than or equal to about 260° C., greater than or equal to about 270° C., greater than or equal to about 280° C., greater than or equal to about 290° C., or greater than or equal to about 300° C. The reaction temperature for the core formation may be less than or equal to about 350° C., for example, less than or equal to about 340° C., less than or equal to about 330° C., less than or equal to about 320° C., or less than or equal to about 310° C. The reaction time for the core formation is not particularly limited and may be selected appropriately.

The reaction temperature for the shell formation may be selected appropriately in any suitable range of greater than or equal to about 200° C., for example, greater than or equal to about 210° C., greater than or equal to about 220° C., greater than or equal to about 230° C., greater than or equal to about 240° C., greater than or equal to about 250° C., greater than or equal to about 260° C., greater than or equal to about 270° C., greater than or equal to about 280° C., or greater than or equal to about 290° C. and less than or equal to about 340° C., for example, less than or equal to about 325° C. The reaction time for the shell formation may be selected appropriately in light of a desired shell composition.

In a reaction system for the core formation and a reaction system for the shell formation, an amount of each precursor and a concentration thereof may be selected taking into consideration a desired composition of the core and the shell, a reactivity between the core and shell precursors, or the like. In an embodiment, taking into consideration a desired composition of a final quantum dot (e.g., a ratio, e.g., mole ratio, between elements such as Zn, S, Se, Te, or a combination thereof), ratios between the precursors may be controlled. The composition of the final quantum dot may be determined by an appropriate analysis tool such as an inductively coupled plasma atomic emission spectroscopy.

After the formation of the core, the shell, or a combination thereof, a non-solvent is added to reaction products and the nanocrystal particles coordinated with, e.g., bound to, the ligand compound may be separated. The non-solvent may be a polar solvent that is miscible with the solvent used in the core formation reaction, shell formation reaction, or a combination thereof and is not capable of dispersing the produced nanocrystals therein. The non-solvent may be selected taking into consideration the solvent used in the reaction and may be for example acetone, ethanol, butanol, isopropanol, ethanediol, water, tetrahydrofuran (THF), dimethylsulfoxide (DMSO), diethyl ether, formaldehyde, acetaldehyde, a solvent having a similar solubility parameter to the foregoing non-solvents, or a combination thereof. Separation of the nanocrystal particles may involve centrifugation, sedimentation, chromatography, or distillation. The separated nanocrystal particles may be added to a washing (or dispersing) solvent and washed (or dispersed), if desired.

Types of the washing (dispersing) solvent are not particularly limited and a solvent having similar solubility parameter to that of the ligand may be used and examples thereof may include hexane, heptane, octane, chloroform, toluene, benzene, or the like.

In an embodiment, a quantum dot composition includes the aforementioned (e.g., a plurality of) core-shell quantum dot(s) (hereinafter, may be referred to simply as a quantum dot or quantum dots); and optionally a (photo)polymerizable monomer having a, e.g., at least one, carbon-carbon double bond. The composition may further include an organic solvent, a liquid vehicle, a dispersing agent (e.g., a binder monomer or polymer), a (photo) initiator; or a combination thereof. The binder monomer or polymer may include a carboxylic acid group.

An amount of the quantum dot(s) in the composition (or a composite as described herein) may be appropriately adjusted taking into consideration a desirable final use (e.g., a photoluminescent color filter, etc.) and components of the composition (or the composite). In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total solids content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt %, based on a total solids content of the composition.

The composition according to an embodiment may be used to produce a quantum dot-polymer composite pattern. The composition according to an embodiment may be a quantum dot-containing photoresist composition to which a photolithography method may be applied. The composition according to an embodiment may be an ink composition that may provide a pattern by printing (e.g., a droplet discharge method such as inkjet printing).

The binder polymer may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure in which two aromatic rings are bound to a quaternary carbon atom that is a constituent atom of another cyclic moiety in the main chain and including a carboxylic acid group (—COOH) (hereinafter, a cardo binder); or a combination thereof.

Details of the quantum dot composition (e.g., a photosensitive composition) may refer to US-2017-0059988-A1, the entire contents of which are incorporated herein as reference.

In an embodiment, an electronic device may include the quantum dot(s). The electronic device may include a display device, a light emitting diode (LED), an organic light emitting diode (OLED), a QD LED, a sensor, a solar cell, an imaging sensor, or a liquid crystal display (LCD), but is not limited thereto.

In an embodiment, the electronic device may be a photoluminescent device (e.g., a lighting system such as a quantum dot sheet, a quantum dot rail, a backlight unit, or the like, or a liquid crystal display) or an electroluminescent device (e.g., QD light emitting diode (LED)). In a non-limiting example, the electronic device may include a quantum dot sheet and the foregoing quantum dots may be included in the QD sheet for example, as a semiconductor nanocrystal-polymer composite.

In an embodiment, a display device includes a light emitting element (e.g., photoluminescence element), and the light emitting element includes the aforementioned quantum dot composite. The display device may further include a light source that is configured to provide the light emitting element with incident light. The incident light may have a (photoluminescence) peak wavelength of greater than or equal to about 440 nm, for example, greater than or equal to about 450 nm, or greater than or equal to about 500 nm and less than or equal to about 560 nm, less than or equal to about 540 nm, less than or equal to about 500 nm, less than or equal to about 480 nm, less than or equal to about 470 nm, or less than or equal to about 460 nm.

Figure 3:
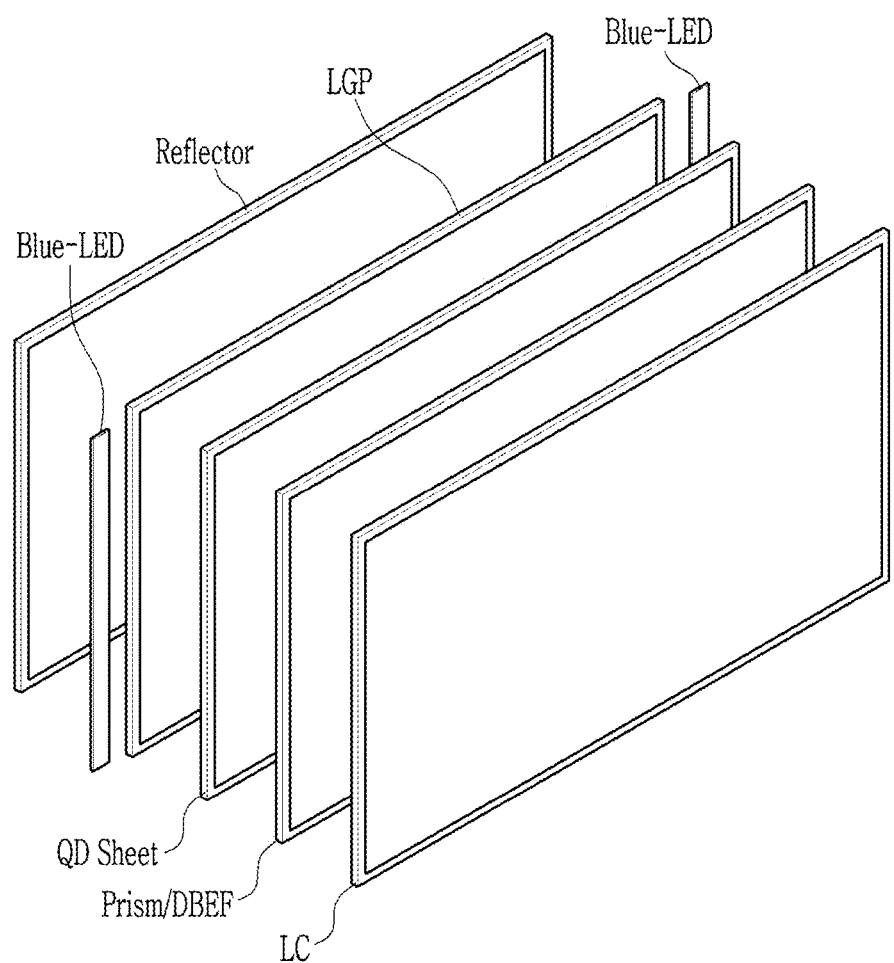
FIG. 3 is an exploded view of a display device according to an embodiment.

In an embodiment, the light emitting element may include a sheet of the quantum dot polymer composite. The display device may further include a liquid crystal panel and the sheet of the quantum dot polymer composite may be disposed between the light source and the liquid crystal panel. FIG. 3 shows an exploded view of a display device. Referring to FIG. 3, the display device may have a structure wherein a reflector, a light guide panel (LGP) and a blue LED light source (Blue-LED), the quantum dot-polymer composite sheet (QD sheet), and various optical films such as a prism, double brightness enhance film (DBEF), and the like are stacked, and a liquid crystal panel is disposed thereon.

In an embodiment, the display device may include a stacked structure including a (e.g., transparent) substrate and a light emitting layer (e.g., a photoluminescent layer) disposed on the substrate as a light emitting element. In the stacked structure, the light emitting layer includes a pattern of the quantum dot polymer composite, and the pattern may include a, e.g., at least one, repeating section configured to emit light of a predetermined wavelength. The pattern of the quantum dot polymer composite may include a first repeating section that may emit a first light, a second repeating section that may emit a second light, or a combination thereof.

The first light and the second light have a different maximum photoluminescence peak wavelength in a photoluminescence spectrum. In an embodiment, the first light may be red light (R) having a maximum photoluminescence peak wavelength of about 600 nm to about 650 nm (e.g., about 620 nm to about 650 nm), the second light may be green light (G) having a maximum photoluminescence peak wavelength of about 500 nm to about 560 nm (e.g., about 510 nm to about 550 nm), or vice versa (i.e., the first light may be a green light and the second light may be a red light).

The substrate may be a substrate including an insulation material. The substrate may include a material of glass; various polymers such as a polyester (e.g., a poly(ethylene terephthalate) (PET), a poly(ethylene naphthalate) (PEN), or the like), a polycarbonate, a poly(C1 to C10 alkyl (meth) acrylate), a polyimide, a polyamide, or a combination thereof (e.g., a copolymer or a mixture thereof); a polysiloxane (e.g., polydimethylsiloxane (PDMS)); an inorganic material such as $Al_2O_3$ or ZnO; or a combination thereof, but is not limited thereto. A thickness of the substrate may be desirably selected taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

At least a portion of the substrate may be configured to cut (absorb or reflect) blue light. A layer capable of blocking (e.g., absorbing or reflecting) blue light, also referred to herein as a "blue cut layer" or "blue light absorption layer", may be disposed on a, e.g., at least one, surface of the substrate. For example, the excitation light cut layer (blue light absorption layer) may include an organic material and a predetermined dye, such as, for example, a yellow dye or a dye capable of absorbing blue light and transmitting green light, red light, or green light and red light.

In an embodiment, a method of producing the stacked structure includes forming a film of the composition described herein on a substrate;

exposing a selected region of the film to light (e.g., having a wavelength of less than or equal to about 400 nm); and developing the exposed film with an alkali developing solution to obtain a pattern of the quantum dot polymer composite.

Details of the substrate and the composition are the same as described herein. The aforementioned composition is coated to have a predetermined thickness on a substrate in an appropriate method of spin coating, slit coating, and the like. If desired, the formed film may be pre-baked (PRB). Conditions (such as a temperature, a duration, and an atmosphere) for the pre-baking may be selected appropriately.

The formed (and optionally, pre-baked) film is exposed to light of a predetermined wavelength (ultraviolet (UV) light) under a mask having a predetermined pattern. The wavelength and the intensity of light may be selected taking into consideration the types and the amounts of the photoinitiator, the types and the amounts of quantum dots, or the like.

The film having the exposed selected area is treated (e.g., sprayed or immersed) with an alkali developing solution, and thereby the unexposed region in the film is dissolved to provide a desired pattern, this process being referred to as development. The obtained pattern may be post-baked (FOB), if desired, for example, at a temperature of about 150° C. to about 230° C. for a predetermined time, for example, greater than or equal to about 10 min or greater than or equal to about 20 min, in order to improve crack resistance and solvent resistance of the pattern, When the quantum dot-polymer composite pattern has a plurality of repeating sections, a quantum dot-polymer composite having a desired pattern may be obtained by preparing a plurality of compositions including a quantum dot (e.g., a red light emitting quantum dot, a green light emitting quantum dot, or optionally, a blue light emitting quantum dot) having desired photoluminescence properties (a photoluminescence peak wavelength and the like) to form each repeating section and repeating the pattern formation process for each of the composition (e.g., twice or more or three times or more) as desired to form a desired pattern of the quantum dot polymer composite.

In an embodiment, an ink composition of an embodiment including the population of the cadmium free quantum dots and the liquid vehicle may be used to form a pattern. For example, a pattern may be formed by depositing the ink composition including a plurality of cadmium free quantum dots, a liquid vehicle, and a monomer on a desired region of a substrate, optionally removing the liquid vehicle, and conducting a polymerization.

For example, the quantum dot-polymer composite may be in the form of a pattern of at least two different repeating color sections (e.g., RGB sections). Such a quantum dot-polymer composite pattern may be used as a photoluminescence-type color filter in a display device.

In an embodiment, the display device (or the light emitting element) may include a stacked structure.

When the display device including the stacked structure includes the light source, the display device may include a plurality of light emitting units respectively corresponding to the first section and the second section, and the light emitting units may include a first electrode and a second electrode facing each other and an electroluminescent layer disposed between the first electrode and the second electrode.

The electroluminescent layer may include an organic light emitting material. For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device such as the organic light emitting diode (OLED) are not particularly limited.

Figure 4A:
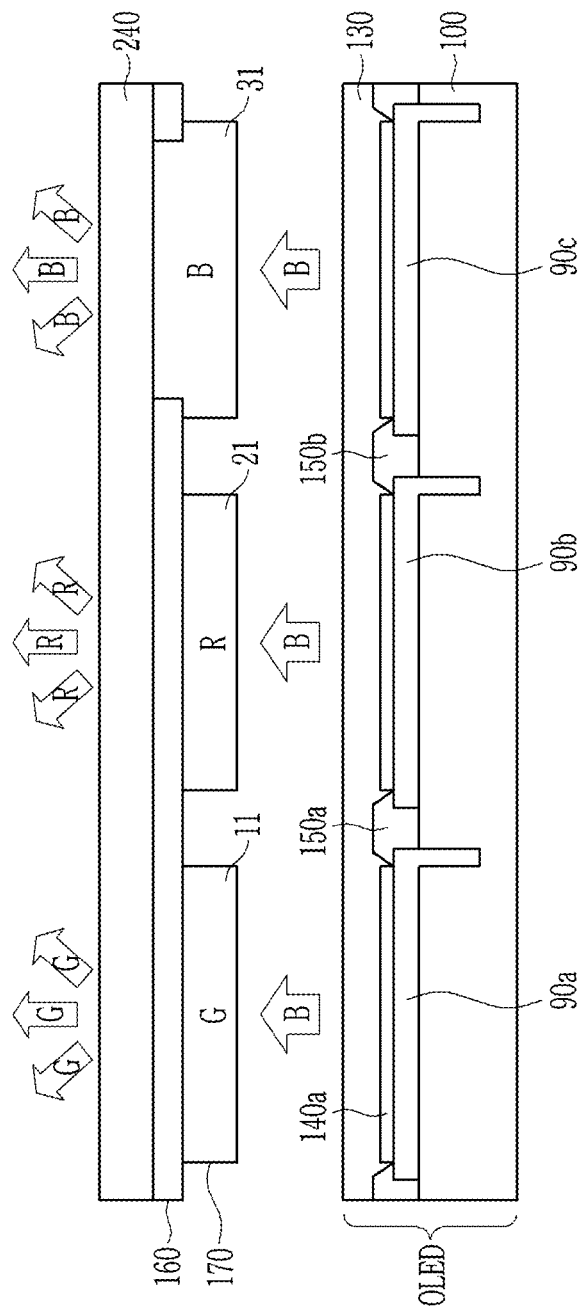
FIG. 4A is a schematic cross-sectional view of a display device according to an embodiment.
Figure 4B:
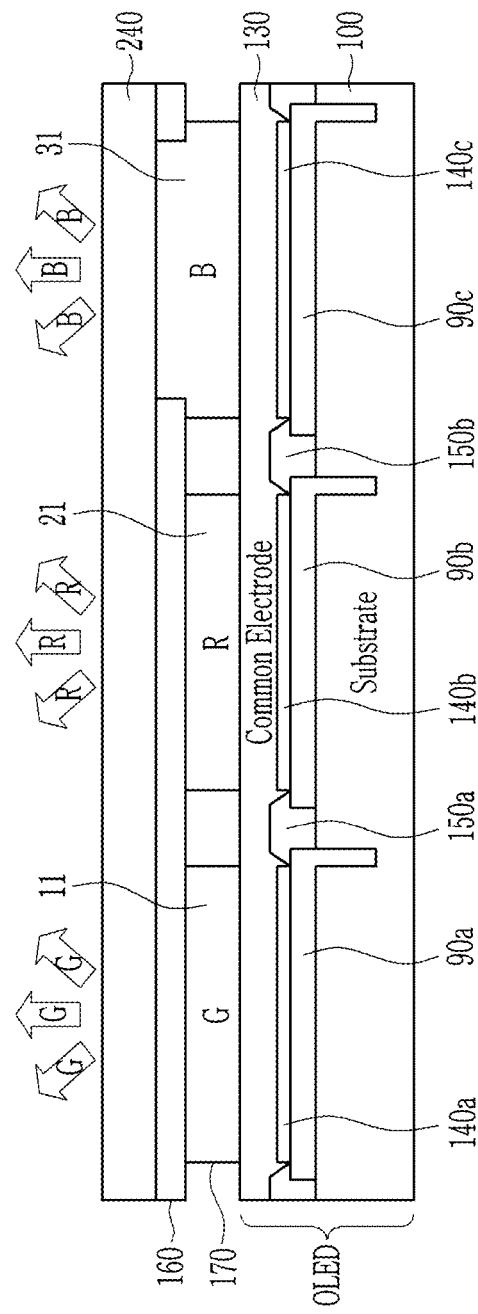
FIG. 4B is a schematic cross-sectional view of a display device according to an embodiment.

FIG. 4A is a schematic cross-sectional view of a display device according to an embodiment and FIG. 4B is a schematic cross-sectional view of a display device according to an embodiment. Referring to FIGS. 4A and 4B, a light source includes an organic light emitting diode (OLED) emitting blue light. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c.

A thin film transistor and a substrate may be disposed under the organic light emitting diode (OLED). The pixel areas of the OLED may be disposed corresponding to the first, second, and third sections as described in detail herein, respectively.

A quantum dot composite pattern (e.g., including a first repeating section including green light emitting quantum dots, a second repeating section including red light emitting quantum dots, or a combination thereof) may be disposed for example as a stacked structure further including a substrate, for example, on (e.g., directly on) or over the light source if present.

The light (e.g., blue light, green light, or a combination thereof) emitted from the light source may enter the second section 21 and the first section 11 of the pattern 170 to emit (e.g., converted) red light R and green light G, respectively. The blue light B emitted from the light source passes through or transmits from the third section 31.

Over the second section 21 emitting red light, the first section 11 emitting green light, or a combination thereof, an optical element 160 may be disposed. The optical element may be an excitation light cut layer or a first optical filter, which cuts (e.g., reflects or absorbs) the excitation light (e.g., blue light, green light, or a combination thereof). The excitation light cut layer or optical element 160 may be disposed on the upper substrate 240. The excitation light cut layer 160 may be disposed under the upper substrate 240 (e.g., on a bottom surface of the upper substrate 240). The excitation light cut layer 160 may be disposed between the upper substrate 240 and the quantum dot-polymer composite pattern and over the first section 11 and the second section 21 and if desired, the third section 31. Details of the excitation light cut layer are the same as set forth for the first optical filter herein.

The display device may be obtained by separately fabricating the stack structure and (e.g., blue light emitting) LED or OLED and then assembling the same. Alternatively, the display device may be obtained by forming a quantum dot-polymer composite pattern directly on the LED or OLED.

In an embodiment, the display device may further include a lower substrate 210, an optical element (e.g., polarizer) 300 disposed below the lower substrate 210, and a liquid crystal layer 220 interposed between the stacked structure and the lower substrate 210. The stacked structure may be disposed in such a manner that a light emitting layer (i.e., the quantum dot-polymer composite pattern) faces the liquid crystal layer. The display device may further include an optical element (e.g., polarizer) 300 between the liquid crystal layer 220 and the light emitting layer. The light source may further include an LED and optionally a light guide panel.

Figure 5:
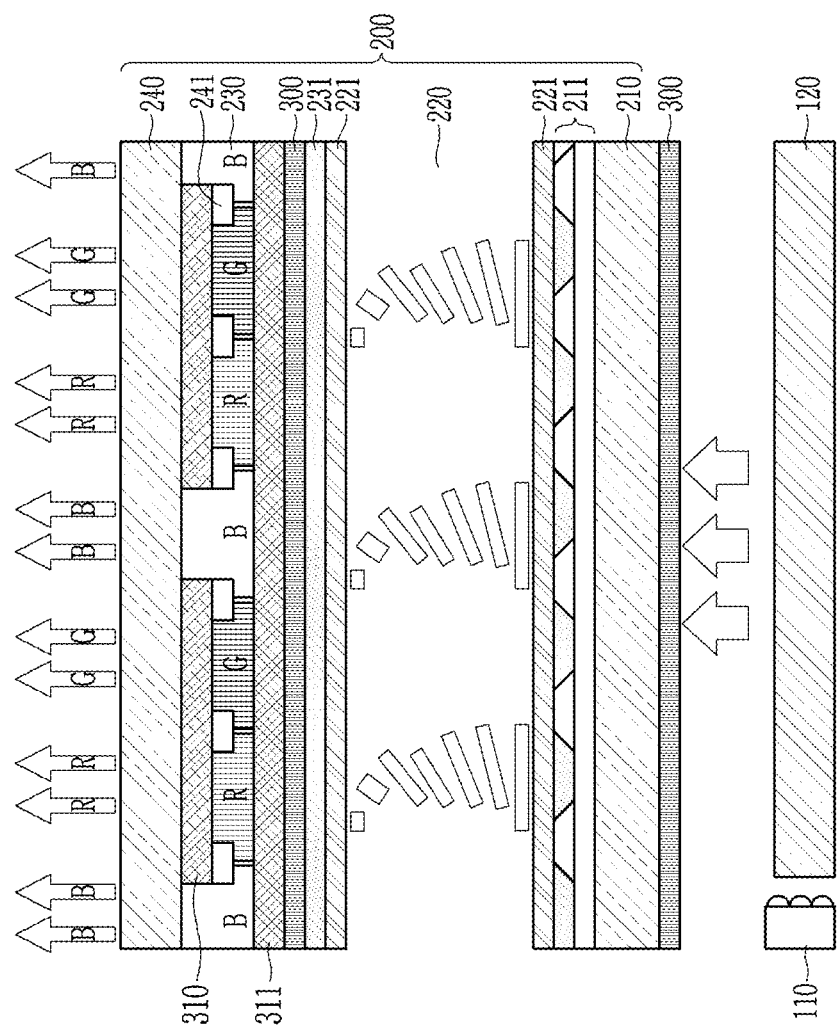
FIG. 5 is a schematic cross-sectional view of a display device according to an embodiment.

Referring to FIG. 5, in an embodiment, the display device may include a liquid crystal panel 200, a lower optical element 300 (e.g., polarizer) disposed on the liquid crystal panel 200, under the liquid crystal panel 200, or a combination thereof and a backlight unit including a blue light emitting light source 110 under a lower optical element 300. The backlight unit may include a light source 110 and a light guide panel 120 (edge type). Alternatively, the backlight unit may be a direct light source without a light guide panel. The liquid crystal panel 200 may include a lower substrate 210, an upper substrate 240, and a liquid crystal layer 220 between the upper and lower substrates, and a light emitting layer (color filter layer) 230 disposed on or under the upper substrate 240. The light emitting layer 230 may include the quantum dot-polymer composite (or a pattern thereof).

A wire plate 211 is provided on an internal surface, for example, on the upper surface of the lower substrate 210. The wire plate 211 may include a plurality of gate wires and data wires that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on an upper surface of the liquid crystal layer 220 and on a lower surface of the liquid crystal layer 220, to initially align the liquid crystal material included therein. Details regarding a liquid crystal material, an alignment layer material, a method of forming an alignment layer, a method of forming a liquid crystal layer, a thickness of liquid crystal layer, or the like are not particularly limited.

In an embodiment, an upper optical element or an upper polarizer 300 may be provided between the liquid crystal layer 220 and the upper substrate 240. For example, the upper optical element or upper polarizer 300 may be disposed between the liquid crystal layer 220 (or a common electrode 231) and the light emitting layer (or the quantum dot-polymer composite pattern). A black matrix 241 may be provided under the upper substrate 240 (e.g., on a lower surface thereof). Openings within the black matrix 241 are aligned with (or provided to hide) a gate line, a data line, and a thin film transistor of a wire plate 211 on the lower substrate 210. A second section (R) including a color filter emitting red light, a first section (G) including a color filter emitting green light, a third section (B) including a color filter for emitting or transmitting blue light, or a combination thereof may be disposed in the openings within the black matrix 241 (BM). For example, the black matrix 241 may have a lattice shape. If desired, the light emitting layer may further include a, e.g., at least one, a fourth repeating section. The fourth repeating section may be configured to emit light having a color (e.g., cyan, magenta, yellow, or the like) different from the colors of the light emitted from the first to third sections.

The light emitting layer (color filter layer) 230 may be on a transparent common electrode 231.

If desired, the display device may further include an excitation light cut layer (e.g., blue cut filter or green cut filter) 310, hereinafter, also referred to as a first optical filter layer 310. The first optical filter layer 310 may be disposed between upper surfaces of the second section (R) and the first section (G) and the lower surface of the upper substrate 240, or on an upper surface of the upper substrate (240). The first optical filter layer 310 may include a sheet having openings that correspond to the third section (B) (e.g., a pixel area showing, e.g., emitting, a blue color) and may be formed on portions corresponding to the first and second sections (G, R). The first optical filter layer 310 may be formed as a single body structure over the portions of the light emitting layer 230 corresponding to the first and second sections (G, R), and which are other than the portions overlapping the third section, but is not limited thereto. Alternatively, at least two first optical filter layers may be spaced apart from each other and may be disposed over each of the portions overlapping the first and the second sections, respectively.

For example, the first optical filter layer may block light having a predetermined wavelength range in the visible light range and may transmit light having another wavelength range. For example, the first optical filter layer may block blue (or green) light and transmit light other than blue light (or other than green light). For example, the first optical filter layer may transmit green light, red light, or yellow light (e.g., the mixed light of the green light and the red light).

The first optical filter layer may include a polymer thin film including a dye that absorbs light having a specific wavelength, i.e., the wavelength to be blocked, a pigment that absorbs light having a specific wavelength, i.e., the wavelength to be blocked, or a combination thereof. The first optical filter layer may block at least 80%, at least 90%, or at least 95% of blue light having a wavelength of less than or equal to about 480 nm. With respect to the visible light having other wavelengths, the first optical filter layer may have a light transmittance of greater than or equal to about 70%, for example, greater than or equal to about 80%, greater than or equal to about 90%, or up to 100%.

The first optical filter layer may absorb and substantially block blue light having a wavelength of less than or equal to about 500 nm, and for example, may selectively transmit green light or red light. At least two first optical filter layers may be spaced apart and disposed on each of the portions overlapping the first and second sections, respectively. For example, the first optical filter layer selectively transmitting red light may be disposed on the portion overlapping the section emitting red light and the first optical filter layer selectively transmitting green light may be disposed on the portion overlapping the section emitting green light. If the excitation light includes the blue light and the green light, a first optical filter blocking the green light and transmitting the blue light may be disposed over the blue light emission section.

In an embodiment, the first optical filter layer may include a first region, a second region, or a combination thereof. The first region of the first optical filter layer blocks (e.g., absorbs) blue light and red light and transmits light having a wavelength of a predetermined range, e.g., a wavelength greater than or equal to about 500 nm, greater than or equal to about 510 nm, or greater than or equal to about 515 nm, and less than or equal to about 550 nm, less than or equal to about 540 nm, less than or equal to about 535 nm, less than or equal to about 530 nm, less than or equal to about 525 nm, or less than or equal to about 520 nm. The second region of the first optical filter layer blocks (e.g., absorb) blue light and green light and transmits light having a wavelength of a predetermined range, e.g., a wavelength of greater than or equal to about 600 nm, greater than or equal to about 610 nm, or greater than or equal to about 615 nm and less than or equal to about 650 nm, less than or equal to about 640 nm, less than or equal to about 635 nm, less than or equal to about 630 nm, less than or equal to about 625 nm, or less than or equal to about 620 nm. The first region of the first optical filter layer may be disposed (directly) on or over a location overlapping a green light emitting section and the second region of the first optical filter layer may be disposed (directly) on or over a location overlapping a red light emitting section. The first region and the second region may be optically isolated from one another, for example, by a black matrix. The first optical filter layer may contribute to improving the color purity of a display device.

The first optical filter layer may be a reflection type filter including a plurality of layers (e.g., inorganic material layers) each having a different refractive index. For example, in the first optical filter layer, two layers having different refractive indices may be alternately stacked on each other. For example, a layer having a high refractive index and a layer having a low refractive index may be alternately laminated with each other.

The display device may further include a second optical filter layer 311 (e.g., red/green light or yellow light recycling layer) that is disposed between the light emitting layer 230 and the liquid crystal layer 220, and between the light emitting layer 230—(e.g., the quantum dot polymer composite layer) and the upper polarizer 300. The second optical filter layer 311 may transmit at least a portion of a third light, and reflect at least a portion of a first light, a second light, or a first light and a second light. The second optical filter layer may reflect light having a wavelength of greater than 500 nm. The first light may be green (or red) light, the second light may be red (or green) light, and the third light may be blue light.

Figure 6:
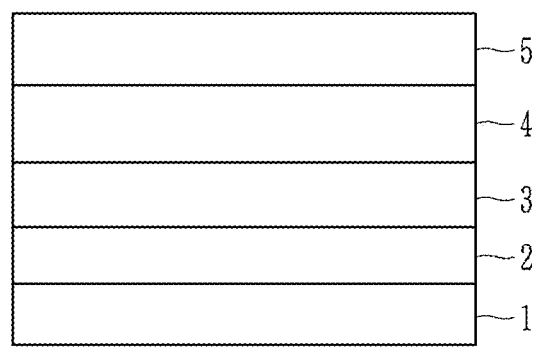
FIG. 6 is a schematic cross-sectional view of a light emitting device according to an embodiment.

The quantum dots may be used in a luminescent layer in a quantum dot based electroluminescent device (see FIG. 6). The electroluminescent device may include an anode 1 and a cathode 5 facing each other; a quantum dot emission layer 3 disposed between the anode and the cathode and including a plurality of quantum dots, and a hole auxiliary layer 2 disposed between the anode and the quantum dot emission layer. The hole auxiliary layer may include a hole injecting layer (HIL), a hole transporting layer (HTL), an electron blocking layer (EBL), or a combination thereof. The hole auxiliary layer may include a suitable organic/inorganic material having a hole property. The electroluminescent device may further include an electron auxiliary layer 4 between the cathode and the quantum dot emission layer. The electron auxiliary layer may include an electron injecting layer (EIL), an electron transporting layer (ETL), a hole blocking layer (HBL), or a combination thereof. The electron auxiliary layer may include a suitable organic/inorganic material having an electron property.

Hereinafter, the embodiments are illustrated in more detail with reference to examples. However, they are exemplary examples of the present disclosure, and the present disclosure is not limited thereto.

EXAMPLES

Analysis Method
1. Photoluminescence Analysis

A photoluminescence (PL) spectrum of the produced nanocrystals are obtained using a Hitachi F-7000 spectrometer at an irradiation wavelength of 372 nanometers (nm).
2. Ultraviolet (UV) Spectroscopy Analysis UV spectroscopy analysis is performed using an Agilent Cary 5000 spectrometer to obtain a UV-Visible absorption spectrum.
3. Inductively Coupled Plasma (ICP) Analysis An inductively coupled plasma-atomic emission spectroscopy (ICP-AES) analysis is performed using Shimadzu ICPS-8100.
4. Transmission Electron Microscopy (TEM) Analysis A TEM analysis is performed using UT F30 Tecnai electron microscope.
5. X-ray photoelectron Spectroscopy (XPS) Analysis An X-ray photoelectron Spectroscopy analysis is performed using Quantum2000 manufactured by Physical Electronics.

Synthesis is performed under an inert gas atmosphere (nitrogen flowing condition) unless particularly mentioned.

Example 1

Selenium and tellurium are dispersed in trioctylphosphine (TOP) to obtain a 0.4 molar (M) Se/TOP stock solution and a 0.5 M Te/TOP stock solution. The Te/TOP stock solution, an organic ligand including oleyl amine, and lithium aluminum hydride are mixed at room temperature to prepare a mixed solution.

In a 300 milliliters (mL) reaction flask, 0.9 mmol of zinc acetate is dissolved in octadecene together with oleic acid, and is heated under vacuum at 120° C. In one hour, an atmosphere in the reactor is changed into an inert gas and a reaction system is heated to 300° C.

To the heated reaction system is injected the Se/TOP stock solution and the mixed solution, and a reaction is carried out and terminated.

The reactor is cooled to room temperature and acetone is added thereto to obtain precipitates, which are separated via centrifugation, providing ZnTeSe cores. The obtained ZnTeSe cores are dispersed in toluene.

The used amounts of Zn and Se precursors with respect to one mole of Te are controlled to provide a desired composition (e.g., that will be described below as an ICP results) taking into consideration reactivity of each of the precursors. With respect to one mole of Te, the used amount of the hydride compound is 1 mole.

Sulfur is dispersed in trioctylphosphine (TOP) to obtain a 1 molar (M) S/TOP stock solution.

In a 300 mL reaction flask, trioctylamine (TOA) is placed and zinc acetate and oleic acid are added thereto, then the mixture is heated under vacuum at 120° C. for one hour. Then, the atmosphere in the flask is replaced with an inert atmosphere, the flask is heated over 250° C.

An acetone solution of zinc chloride (conc. 1M) is prepared.

To the heated reaction system are added the prepared ZnTeSe cores, the S/TOP stock solution, and the acetone solution of zinc chloride and the reaction proceeds for 10 minutes.

After the completion of the reaction, the flask is cooled to room temperature and acetone is added thereto to generate precipitation, from which the ZnTeSe/ZnS:Cl core-shell quantum dots are recovered via centrifugation. The obtained core-shell quantum dots are dispersed in toluene.

2.14 moles of the sulfur is used per 1 mole of the Te precursor. Also, 0.4 moles of the Cl precursor is used per 1 mole of sulfur.

With respect to the cores and the core-shell quantum dots as prepared, a TEM analysis is made and the results are shown in Table 1.

With respect to the cores and the core-shell quantum dots as prepared, a UV-Vis absorption spectroscopy analysis and a photoluminescent spectroscopy analysis are made and some of the results are summarized in Table 1. The valley depth (VD) of the core-shell quantum dots is about 0.21.

With respect to the core-shell quantum dots as prepared, an ICP-AES analysis is made and the results are shown in Table 2.

An amount of aluminum with respect to the tellurium for the quantum dots is about 0.14. An XPS analysis is made for the core-shell quantum dots thus prepared and the results confirm that a peak that can be assigned to the tellurium oxide is substantially not found. The results of the XPS analysis confirm that the mole ratio of the Cl with respect to the Te is about 0.15:1.

Example 1-1

A core-shell quantum dot is prepared in the same manner as set forth in Example 1 except that the acetone solution of zinc chloride is used during the formation of the core. A Se/TOP stock solution and the mixed solution is injected to the heated reaction medium, and the acetone solution is added thereto. An ICP-AES analysis is made and the chlorine is detected.

Comparative Example 1

ZnTeSe/ZnS Core-shell quantum dots are prepared in the same manner as in Example 1 except that during the shell formation, the acetone solution of the zinc chloride is not used.

With respect to the cores and the core-shell quantum dots as prepared, a TEM analysis is made and the results are shown in Table 1.

With respect to the cores and the core-shell quantum dots as prepared, a UV-Vis absorption spectroscopy analysis and a photoluminescent spectroscopy analysis are made and some of the results are summarized in Table 1. With respect to the core-shell quantum dots as prepared, an ICP AES analysis is made and the results confirm that chlorine is not detected.

An XPS analysis is made for the core-shell quantum dots thus prepared and the results confirm that a peak for a tellurium oxide (or TeO3) is found in binding energy of about 563 eV to about 578 eV.

Example 2

ZnTeSe/ZnSe:Cl Core-shell quantum dots are prepared in the same manner as in Example 1 except that during the shell formation, Se/TOP is used instead of S/TOP.

Additionally, 0.43 mole of the selenium is used per 1 mole of the Te precursor. Also 0.4 moles of the Cl precursor is used per 1 mole of selenium.

Figure 7A:
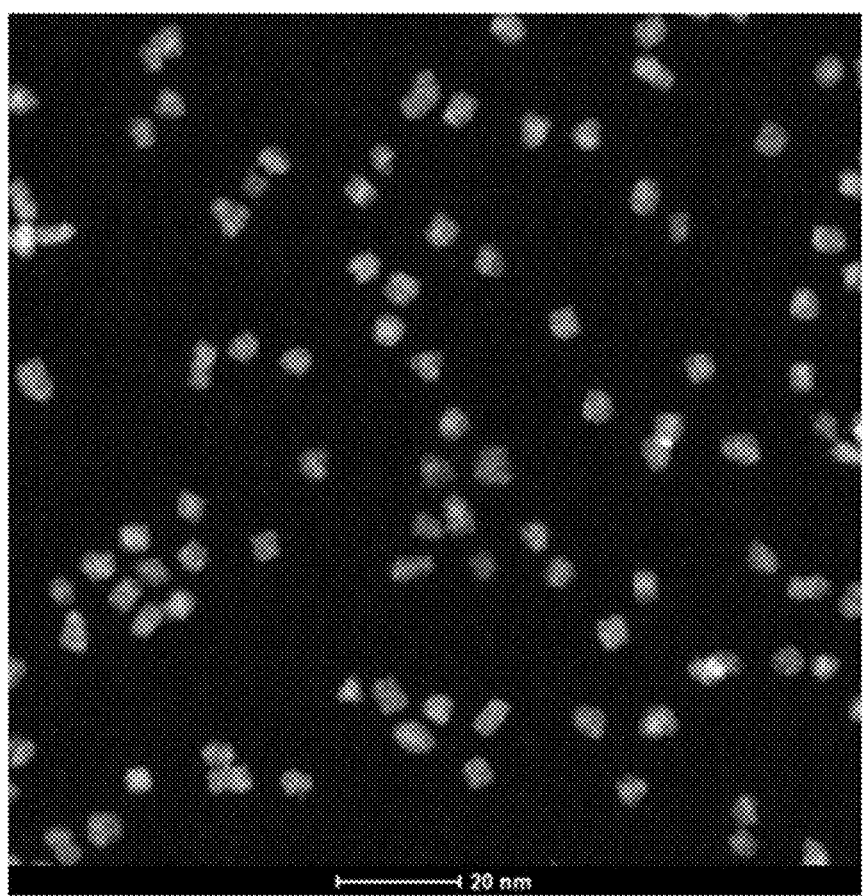
FIG. 7A is a Transmission Electron Microscopy (TEM) image of the quantum dots synthesized in Example 2.

With respect to the cores and the core-shell quantum dots as prepared, a TEM analysis is made and the results are shown in Table 1 and FIG. 7A.

With respect to the cores and the core-shell quantum dots as prepared, a UV-Vis absorption spectroscopy analysis and a photoluminescent spectroscopy analysis are made and some of the results are summarized in Table 1. The valley depth (VD) of the core-shell quantum dots is about 0.13.

With respect to the core-shell quantum dots as prepared, an ICP AES analysis is made and the results are shown in Table 2.

The results of the XPS analysis confirm that the mole ratio of the Cl with respect to the Te is about 0.4:1.

With respect to the core-shell quantum dots as prepared, an ICP-AES analysis is made and the results are shown in Table 2. An amount of aluminum with respect to the tellurium for the quantum dots is about 0.21.

Comparative Example 2-1

ZnTeSe/ZnSe Core-shell quantum dots are prepared in the same manner as in Example 2 except that during the shell formation, the acetone solution of the zinc chloride is not used and the reaction time increase about 30 minutes. The core-shell quantum dots thus obtained are dispersed in toluene.

Figure 7B:
FIG. 7B is a Transmission Electron Microscopy (TEM) image of the quantum dots synthesized in Comparative Example 2-1.

With respect to the cores and the core-shell quantum dots as prepared, a TEM analysis is made and the results are shown in Table 1 and FIG. 7B.

With respect to the cores and the core-shell quantum dots as prepared, a UV-Vis absorption spectroscopy analysis and a photoluminescent spectroscopy analysis are made and some of the results are summarized in Table 1. With respect to the core-shell quantum dots as prepared, an ICP AES analysis is made and the results confirm that chlorine is not detected.

Comparative Example 2-2

ZnTeSe/ZnSe Core-shell quantum dots are prepared in the same manner as in Example 2 except that during the shell formation, a HF solution is used instead of the acetone solution. The core-shell quantum dots thus obtained are dispersed in toluene.

Figure 8:
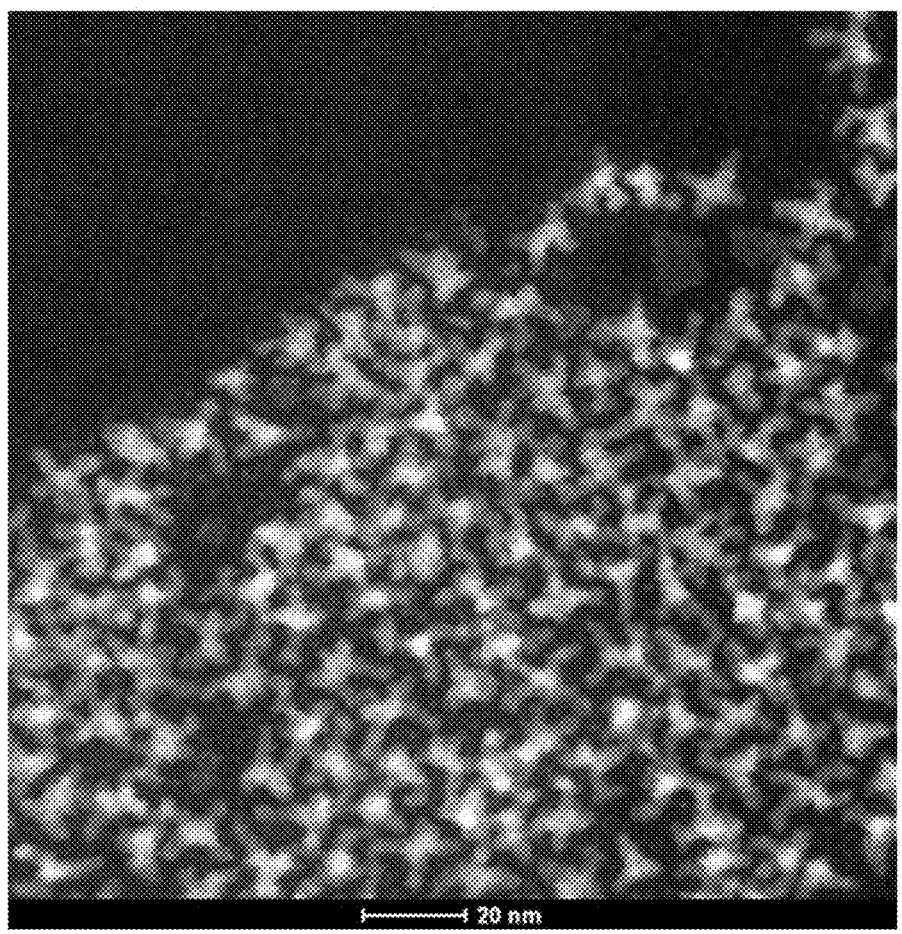
FIG. 8 is a Transmission Electron Microscopy (TEM) image of the quantum dots synthesized in Comparative Example 2-2.

With respect to the cores and the core-shell quantum dots as prepared, a TEM analysis is made and the results are shown in FIG. 8, confirming that the quantum dots thus prepared have irregular shapes.

With respect to the cores and the core-shell quantum dots as prepared, a UV-Vis absorption spectroscopy analysis and a photoluminescent spectroscopy analysis are made and some of the results are summarized in Table 1. With respect to the core-shell quantum dots as prepared, an ICP AES analysis is made and the results confirm that chlorine is not detected.

Example 3

ZnTeSe/ZnSe:Cl core-shell quantum dots are prepared in the same manner as set forth in Example 2. The obtained core-shell quantum dots are dispersed in toluene.

Sulfur is dispersed in trioctylphosphine (TOP) to obtain a 1 molar (M) S/TOP stock solution.

In a 300 mL reaction flask, trioctylamine (TOA) is placed and 0.9 mmol of zinc acetate and oleic acid are added thereto, then the mixture is heated under vacuum at 120° C. for one hour. Then, the atmosphere in the flask is replaced with an inert atmosphere, the flask is heated over 250° C.

An acetone solution of zinc chloride (conc. 1M) is prepared.

To the heated reaction system are added the prepared ZnTeSe/ZnSe:Cl quantum dots, the STOP stock solution, and the acetone solution of zinc chloride and the reaction proceeds for 30 minutes.

After the completion of the reaction, the flask is cooled to room temperature and acetone is added thereto to generate precipitation, from which the ZnTeSe/ZnSe:Cl/ZnS:Cl core-shell quantum dots are recovered via centrifugation. The obtained core-shell quantum dots are dispersed in toluene.

During the formation of the shell, 0.43 moles and 2.14 moles of the selenium and the sulfur are used per 1 mole of the Te precursor, respectively. Also, 0.4 moles of the Cl precursor is used per 1 mole of selenium.

With respect to the cores and the core-shell quantum dots as prepared, a TEM analysis is made and the results are shown in Table 1.

With respect to the cores and the core-shell quantum dots as prepared, a UV-Vis absorption spectroscopy analysis and a photoluminescent spectroscopy analysis are made and some of the results are summarized in Table 1. The valley depth (VD) of the core-shell quantum dots is about 0.12. The results of the XPS analysis confirm that the mole ratio of the Cl with respect to the Te is greater than about 0.4:1.

With respect to the core-shell quantum dots as prepared, an ICP-AES analysis is made and the results are shown in Table 2.

Example 4

ZnTeSe/ZnS:Cl Core-shell quantum dots are prepared in the same manner as in Example 1 except that during the shell formation, $GaCl_3$ are used instead of $ZnCl_2$.

2.14 moles of the sulfur is used per 1 mole of the Te precursor. Also, 0.4 moles of the Cl precursor is used per 1 mole of sulfur.

With respect to the cores and the core-shell quantum dots as prepared, a UV-Vis absorption spectroscopy analysis and a photoluminescent spectroscopy analysis are made and some of the results are summarized in Table 1.

The valley depth (VD) of the core-shell quantum dots is about 0.22. With respect to the core-shell quantum dots as prepared, an ICP AES analysis is made and the results are shown in Table 2.

An amount of gallium with respect to the tellurium for the quantum dots is about 0.015. The results of the XPS analysis confirm that the mole ratio of the Cl with respect to the Te is about 1.48:1.

TABLE 1

|  | 1$^{st}$ absorp. Peak (nm) | FWHM (nm) | PL WL (nm) | QY (%) | Avg. size (nm) | Solidity (%) | Round-ness |
|---|---|---|---|---|---|---|---|
| Example1 ZnTeSe/ZnS:Cl | 496 | 27 | 516 | 54 | 4.76 | 0.94 | 0.87 |
| Comp. Example 1 ZnTeSe/ZnS | 496 | 27 | 516 | 25 | 6.44 | — | — |

TABLE 1-continued

|  | 1st absorp. Peak (nm) | FWHM (nm) | PL WL (nm) | QY (%) | Avg. size (nm) | Solidity (%) | Round-ness |
|---|---|---|---|---|---|---|---|
| Example 2 ZnTeSe/ZnSe:Cl | 508 | 27 | 525 | 36 | 5.15 | 0.94 | 0.82 |
| Comp. Example 2-1 ZnTeSe/ZnSe | NA | 52 | 574 | 8 | 10.03 | 0.7 | 0.64 |
| Comp. Example 2-2 ZnTeSe/ZnSe (HF used) | NA | 40 | 561 | 19 | — | — | — |
| Example 3 ZnTeSe/ZnSe:Cl/ ZnS:Cl | 512 | 29.2 | 529 | 60.6 | 5.36 | 0.93 | 0.83 |
| Example 4 (GaCl3 used) | 497 | 25 | 514 | 31 | — | — | — |

FWHM: Full Width at Half Maximum (nm)
Roundness and Solidity, average value, confirmed by Image J program of a TEM result
Avg. Size: average size
PL: photoluminescent
WL: wavelength
QY: quantum efficiency (%)

The results of Table 1 confirm that the quantum dots of the Examples may have improved luminous properties, improved shape properties, or a combination thereof. The results of FIG. 7a and FIG. 7b confirm that the addition of the chlorine may result in improved shape uniformity.

TABLE 2

| | ICP (a mole ratio with respect to Te) | | |
|---|---|---|---|
| | Zn:Te | Se:Te | S:Te |
| Example 1 | 2.24:1 | 0.46:1 | 0.27:1 |
| Example 2 | 2.18:1 | 0.82:1 | 0:1 |
| Example 3 | 5.73:1 | 0.74:1 | 0.66:1 |
| Example 4 | 2.1:1 | 0.46:1 | 0.21:1 |

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A core-shell quantum dot comprising
a core comprising a first semiconductor nanocrystal, the first semiconductor nanocrystal comprising zinc, tellurium, and selenium; and
a semiconductor nanocrystal shell disposed on the core, the semiconductor nanocrystal shell comprising
zinc; and
selenium, sulfur, or a combination thereof,
wherein the core-shell quantum dot does not comprise cadmium, lead, mercury, or a combination thereof,
wherein the core-shell quantum dot further comprises chlorine,
wherein in the core-shell quantum dot, a mole ratio of chlorine with respect to tellurium is greater than or equal to about 0.01:1, and
wherein a quantum efficiency of the core-shell quantum dot is greater than or equal to about 10%.

2. The core-shell quantum dot of claim 1, wherein in the core-shell quantum dot, a mole ratio of tellurium with respect to selenium is greater than about 0.4:1.

3. The core-shell quantum dot of claim 1, wherein in the core-shell quantum dot, a mole ratio of tellurium with respect to selenium is greater than or equal to about 0.1:1 and less than or equal to about 4:1.

4. The core-shell quantum dot of claim 1, wherein in the core-shell quantum dot, a mole ratio of chlorine with respect to tellurium is greater than or equal to about 0.05:1.

5. The core-shell quantum dot of claim 1, wherein the core does not comprise a Group III-V compound comprising indium or gallium.

6. The core-shell quantum dot of claim 1, wherein the core-shell quantum dot further comprises aluminum, gallium, lithium, fluorine, or a combination thereof.

7. The core-shell quantum dot of claim 1, wherein the first semiconductor nanocrystal comprises $ZnTe_xSe_{1-x}$, wherein x is greater than or equal to about 0.4 and less than or equal to about 0.9.

8. The core-shell quantum dot of claim 1, wherein the semiconductor nanocrystal shell comprises selenium and sulfur and a mole ratio of sulfur with respect to selenium is greater than 0:1 and less than or equal to about 4:1.

9. The core-shell quantum dot of claim 1, wherein a maximum luminescent peak wavelength of the core-shell quantum dot is in a range of greater than about 470 nanometers and less than or equal to about 600 nanometers.

10. The core-shell quantum dot of claim 1, wherein the maximum photoluminescent peak of the core-shell quantum dot has a full width at half maximum of less than or equal to about 40 nanometers.

11. The core-shell quantum dot of claim 1, wherein the quantum efficiency of the core-shell quantum dot is greater than or equal to about 20%.

12. The core-shell quantum dot of claim 1, wherein the core-shell quantum dot comprises an organic ligand and the organic ligand comprises RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', RHPO(OH), $RPO(OH)_2$, $R_2POOH$, a polymeric organic ligand, or a combination thereof, wherein R and R' are the same or different and are each independently a substituted or unsubstituted C1 to C40 aliphatic hydrocarbon group, a substituted or unsubstituted C6 to C40 aromatic hydrocarbon group, or a combination thereof.

13. A quantum dot population comprising a plurality of the core-shell quantum dot of claim 1, wherein an average roundness of the plurality of the core-shell quantum dots is greater than or equal to about 0.70; or wherein an average solidity of the plurality of the core-shell quantum dots is greater than or equal to about 0.8.

14. The quantum dot population of claim 13, wherein an average size of the plurality of the core-shell quantum dots is greater than or equal to about 7 nanometers.

15. A method of manufacturing the core-shell quantum dot of claim 1, comprising:

preparing a zinc precursor organic solution comprising a zinc precursor and a first organic ligand in a first organic solvent; and while heating the zinc precursor organic solution, adding a first selenium precursor, a tellurium precursor, a metal hydride compound, and a second organic ligand to the zinc precursor organic solution to prepare a core particle, reacting a zinc precursor with a second selenium precursor, a sulfur precursor, or a combination thereof in a third organic solvent in the presence of the core particle and a shell formation organic ligand to form a semiconductor nanocrystal shell on the core particle, and adding a chlorine precursor to a reaction system during preparation of the core particle, during formation of the semiconductor nanocrystal shell, or during the preparation of the core particle and the formation of the semiconductor nanocrystal shell.

16. The method of claim 15, further comprising adding a fluorine precursor to the reaction system during preparation of the core particle, during formation of the semiconductor nanocrystal shell, or during the preparation of the core particle and the formation of the semiconductor nanocrystal shell.

17. The method of claim 15, wherein the tellurium precursor comprises tellurium dispersed in a second organic solvent and wherein a concentration of the tellurium in the tellurium precursor is greater than about 0.1 moles per liter.

18. The method of claim 15, further comprising mixing the tellurium precursor, the metal hydride compound, and the second organic ligand to form a mixed solution at a temperature of less than about 80° C. prior to adding to the zinc precursor organic solution.

19. The method of claim 15, further comprising preparing the chlorine precursor by dissolving a chlorine compound in a fourth organic solvent, wherein the fourth organic solvent comprises a C1 to C30 alcohol, a C2 to C30 ketone solvent, a C1 to C40 alkylphosphine solvent, or a combination thereof.

20. A display device comprising a light emitting element, wherein the light emitting element comprises a plurality of the core-shell quantum dot of claim 1.

21. The display device of claim 20, wherein the light emitting element comprises a stacked structure comprising a substrate and a patterned light emitting layer, wherein the patterned light emitting layer comprises a first repeating section configured to emit light at a predetermined wavelength, and wherein the first repeating section comprises the plurality of the core-shell quantum dots.

22. The core-shell quantum dot of claim 1, wherein the core-shell quantum dot is configured to emit green light.

23. The core-shell quantum dot of claim 1, wherein the semiconductor nanocrystal shell comprises chlorine.

24. The core-shell quantum dot of claim 1, wherein the core comprises chlorine.

* * * * *